(12) United States Patent
Lee et al.

(10) Patent No.: US 8,258,591 B2
(45) Date of Patent: Sep. 4, 2012

(54) MICRO-ELECTRO-MECHANICAL SYSTEMS (MEMS) DEVICE

(75) Inventors: Chien-Hsing Lee, Hsinchu County (TW); Tsung-Min Hsieh, Taipei County (TW)

(73) Assignee: Solid State System Co., Ltd., Hsinchu (TW)

( * ) Notice: Subject to any disclaimer, the term of this patent is extended or adjusted under 35 U.S.C. 154(b) by 1268 days.

(21) Appl. No.: 12/014,810

(22) Filed: Jan. 16, 2008

(65) Prior Publication Data

US 2009/0179233 A1    Jul. 16, 2009

(51) Int. Cl.
    *H01L 29/84*    (2006.01)
(52) U.S. Cl. ......... 257/416; 438/53; 381/174; 257/420; 257/E23.116
(58) Field of Classification Search ............ 381/175, 381/174, 113, 116, 190, 191; 257/414, 415, 257/420, 350
See application file for complete search history.

(56) References Cited

U.S. PATENT DOCUMENTS

| | | | |
|---|---|---|---|
| 5,929,497 A * | 7/1999 | Chavan et al. ............... | 257/417 |
| 6,140,689 A * | 10/2000 | Scheiter et al. ............... | 257/414 |
| 6,509,231 B1 * | 1/2003 | Chen et al. .................... | 438/261 |
| 7,049,051 B2 | 5/2006 | Gabriel et al. | |
| 7,202,101 B2 | 4/2007 | Gabriel et al. | |
| 7,402,449 B2 * | 7/2008 | Fukuda et al. ............... | 438/53 |
| 7,570,773 B2 * | 8/2009 | Ohbayashi et al. .......... | 381/175 |
| 7,674,685 B2 * | 3/2010 | Choi et al. .................... | 438/427 |
| 7,829,961 B2 * | 11/2010 | Hsiao ............................ | 257/416 |
| 7,912,235 B2 * | 3/2011 | Chen ............................. | 381/174 |
| 2004/0145056 A1 * | 7/2004 | Gabriel et al. ................ | 257/758 |
| 2006/0070449 A1 * | 4/2006 | Yokoyama et al. ............ | 73/754 |
| 2006/0170012 A1 * | 8/2006 | Larmer et al. ................ | 257/252 |
| 2007/0134835 A1 * | 6/2007 | Fukuda et al. ................. | 438/48 |
| 2007/0160247 A1 | 7/2007 | Makihata et al. | |
| 2007/0217635 A1 | 9/2007 | Ogura et al. | |
| 2009/0026561 A1 * | 1/2009 | Reichenbach et al. ....... | 257/416 |

OTHER PUBLICATIONS

Zou et al. "A Novel Integrated Silicon Capacitive Microphone-Floating Electrode "Electret" Microphone (FEEM)," Journal of Microelectromechanical Systems, col. 7, No. 2 Jun. 1998, 11 pages.*
Zou, Q. "A Novel Integrated Silicon Capacitive Microphone-Floating Electrode "Electret" Microphone (FEEM)".J. of Microelectromechanical Systems, vol. 7 (2), 224-234.*

* cited by examiner

*Primary Examiner* — Steven Loke
*Assistant Examiner* — David Goodwin
(74) *Attorney, Agent, or Firm* — Jianq Chyun IP Office

(57) ABSTRACT

The present invention provides a MEMS device, be implemented on many MEMS device, such as MEMS microphone, MEMS speaker, MEMS accelerometer, MEMS gyroscope. The MEMS device includes a substrate. A dielectric structural layer is disposed over the substrate, wherein the dielectric structural layer has an opening to expose the substrate. A diaphragm layer is disposed over the dielectric structural layer, wherein the diaphragm layer covers the opening of the dielectric structural layer to form a chamber. A conductive electrode structure is adapted in the diaphragm layer and the substrate to store nonvolatile charges.

24 Claims, 30 Drawing Sheets

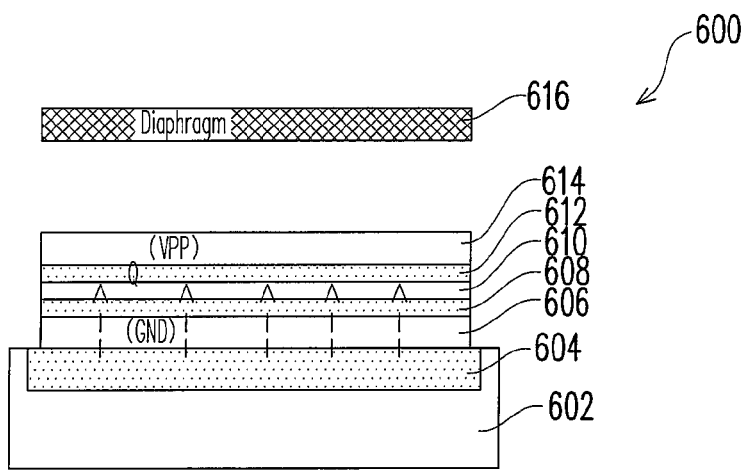
FIG. 6
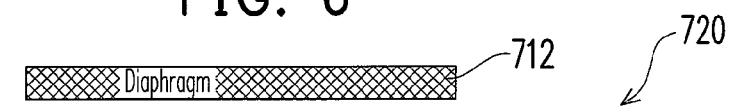
FIG. 7
FIG. 8

MICRO-ELECTRO-MECHANICAL SYSTEMS (MEMS) DEVICE

BACKGROUND OF THE INVENTION

1. Field of Invention

The present invention relates to a micro-electro-mechanical system (MEMS) technology. More particularly, the present invention relates to a MEMS device to form a vibrating diaphragm, can be implemented on many MEMS Device, for example MEMS microphone, MEMS speaker, MEMS accelerometer, MEMS gyroscope.

2. Description of Related Art

MEMS devices have been widely fabricated using semiconductor fabricating process. However, it is still not easy to be integrated into the standard MOS (metal-oxide semiconductor) process, such as complementary MOS (CMOS) device. In general, a discrete MEMS device and a CMOS ASIC chip are packaged to a single die for application. However, the cost and performance for current technology cause not being popular. It is intended to develop a MEMS technology, so that the process for fabricating the MEMS can be compatible with the process for fabricating the CMOS device.

SUMMARY OF THE INVENTION

The invention provides a MEMS device, can be used in a many MEMS device. The MEMS device can include a charge storage structure for storing charges.

The present invention provides a MEMS device. The MEMS device includes a substrate. A CMOS circuit is formed over the substrate at a first region. A MEMS device is formed over the substrate at a second region. The MEMS device includes a dielectric structural layer, disposed over the substrate, wherein the dielectric structural layer has an opening to expose the substrate. A diaphragm layer is disposed over the dielectric structural layer. The diaphragm layer covers the opening of the dielectric structural layer to form a chamber. A conductive electrode structure is adapted in the diaphragm layer to store charges. The charges can pre-charge into the conductive electrode by a program operation, or a bias voltage applied between the conductive electrode and substrate, which will produce constant charges.

According to a further embodiment in the foregoing MEMS device, for example, the diaphragm layer can include an etching stop layer for carrying the conductive electrode structure.

According to another embodiment in the foregoing MEMS device, for example, the MEMS device further comprises a charging device over the substrate for pre-charging the conductive electrode structure.

According to another embodiment in the foregoing MEMS device, for example, the MEMS device further comprises a charge storage structure over the substrate.

According to another embodiment in the foregoing MEMS device, for example, the charge storage structure is charged with a desired amount of charges under a charging operation.

The present invention provides a MEMS device. The MEMS device includes a substrate. A dielectric structural layer is disposed over the substrate, wherein the dielectric structural layer has an opening to expose the substrate. A diaphragm layer is disposed over the dielectric structural layer, wherein the diaphragm layer covers the opening of the dielectric structural layer to form a chamber. A conductive electrode structure is adapted in the diaphragm layer and the substrate to store charges. The charges can pre-charge into the conductive electrode by a program operation, or a bias voltage applied between the conductive electrode and substrate will produce constant charges.

According to another embodiment in the foregoing MEMS device, for example, the diaphragm layer includes an etching stop layer for carrying the conductive electrode structure.

According to another embodiment in the foregoing MEMS device, for example, the conductive electrode structure is directly disposed on the etching stop layer.

According to another embodiment in the foregoing MEMS device, for example, the conductive electrode structure includes an opening to expose the etching stop layer.

According to another embodiment in the foregoing MEMS device, for example, the diaphragm layer includes an etching stop layer and a dielectric layer, and the conductive electrode structure is embedded in the dielectric layer.

According to another embodiment in the foregoing MEMS device, for example, the MEMS device further includes a conductive layer over the diaphragm layer.

According to another embodiment in the foregoing MEMS device, for example, the diaphragm layer includes an etching stop layer and a dielectric layer, and at least a portion of the dielectric layer is between the conductive electrode structure and the etching stop layer.

According to another embodiment in the foregoing MEMS device, for example, the diaphragm layer includes an etching stop layer and at least a portion of the conductive electrode structure is in the etching stop layer.

According to another embodiment in the foregoing MEMS device, for example, a sidewall surface of the conductive electrode structure is covered by the etching stop layer.

According to another embodiment in the foregoing MEMS device, for example, a sidewall surface of the conductive electrode structure is covered by the etching stop layer, and at least one of an upper surface and a bottom surface of the conductive electrode structure is exposed.

According to another embodiment in the foregoing MEMS device, for example, the etching stop layer includes an upper etching stop layer and a lower etching stop layer, the conductive electrode structure is between the upper etching stop layer and a lower etching stop layer.

According to another embodiment in the foregoing MEMS device, for example, the conductive electrode structure is exposed by the etching stop layer.

According to another embodiment in the foregoing MEMS device, for example, the conductive electrode structure is exposed by the lower etching stop layer is not exposed by the upper etching stop layer.

According to another embodiment in the foregoing MEMS device, for example, the conductive electrode structure is embedded in the etching stop layer.

According to another embodiment in the foregoing MEMS device, for example, the diaphragm layer includes a first etching stop layer, a second etching stop layer, and a dielectric layer between the first etching stop layer and the second etching stop layer, wherein the conductive electrode structure is a conductive via in the dielectric layer between the first etching stop layer and the second etching stop layer.

According to another embodiment in the foregoing MEMS device, for example, the substrate has a cavity at a backside and a venting hole in the substrate within the cavity, wherein the chamber is connected to the cavity through the venting hole.

According to another embodiment in the foregoing MEMS device, for example, the MEMS device further includes a semiconductor structure over the substrate, facing to the chamber.

According to another embodiment in the foregoing MEMS device, for example, the MEMS device further includes a conductive electrode structure to store charges.

According to another embodiment in the foregoing MEMS device, for example, the conductive electrode structure comprises a floating conductive layer for storing the charges.

According to another embodiment in the foregoing MEMS device, for example, the substrate covers the chamber, and a semiconductor device is formed on the substrate, facing to the chamber.

According to another embodiment in the foregoing MEMS device, for example, the dielectric structural layer comprises an embedded conductive layer.

According to another embodiment in the foregoing MEMS device, for example, the conductive electrode structure is exposed to the chamber.

According to another embodiment in the foregoing MEMS device, for example, the conductive electrode structure is exposed to an outer space.

The present invention also provides a MEMS device, suitable for use in a many MEMS device, The MEMS device includes a silicon substrate. A dielectric structural layer is disposed over the substrate, wherein the dielectric structural layer has an opening to expose the silicon substrate. A diaphragm layer is disposed over the dielectric structural layer. The diaphragm layer covers the opening of the dielectric structural layer to form a chamber, wherein the diaphragm layer comprises an etching stop layer. A conductive electrode structure is adapted in the diaphragm layer.

According to another embodiment in the foregoing MEMS device, for example, the MEMS device further includes a semiconductor device structure over the substrate, facing to the chamber.

The present invention also provides a method for forming a micro-electro-mechanical systems (MEMS) device comprises providing a substrate. Then, a first structural dielectric layer is formed over the substrate. An etching stop layer is formed over the first structural dielectric layer. A conductive electrode is formed over the first structure dielectric layer. The substrate is patterned from a back side to form a cavity. The substrate is patterned from a back side to form a plurality of perforating openings in the substrate over the cavity to expose the first structural dielectric layer. The first structural dielectric layer is patterned to form a chamber in the first structural dielectric layer, wherein the etching stop layer is used as a stop when etching the first structural dielectric layer.

According to an embodiment, for example, the step of patterning the substrate comprises using a hard mask layer as an etching stop layer for etching the substrate.

According to an embodiment, for example, the step of patterning the substrate comprises forming the perforating hole in the substrate; and etching the substrate to let the perforating hole to expose the first structural dielectric layer.

According to an embodiment, for example, the step of patterning the substrate comprises controlling an etch time to remove a portion of the substrate; and etching the substrate to let the perforating hole to expose the first structural dielectric layer.

According to an embodiment, for example, the step of patterning the first structure dielectric layer comprises performing isotropic dry etch or vapor HF etch.

According to an embodiment, for example, the method further comprises forming another etching stop layer over the conductive electrode.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 4-8 are cross-sectional views, schematically illustrating the operation to charge the MEMS device, according to embodiments of the invention.

DESCRIPTION OF THE PREFERRED EMBODIMENTS

Several embodiments are provided for descriptions but not for limiting the present invention. Also noted, the disclosure in different embodiments may be properly combined as another embodiment.

Figure 1:
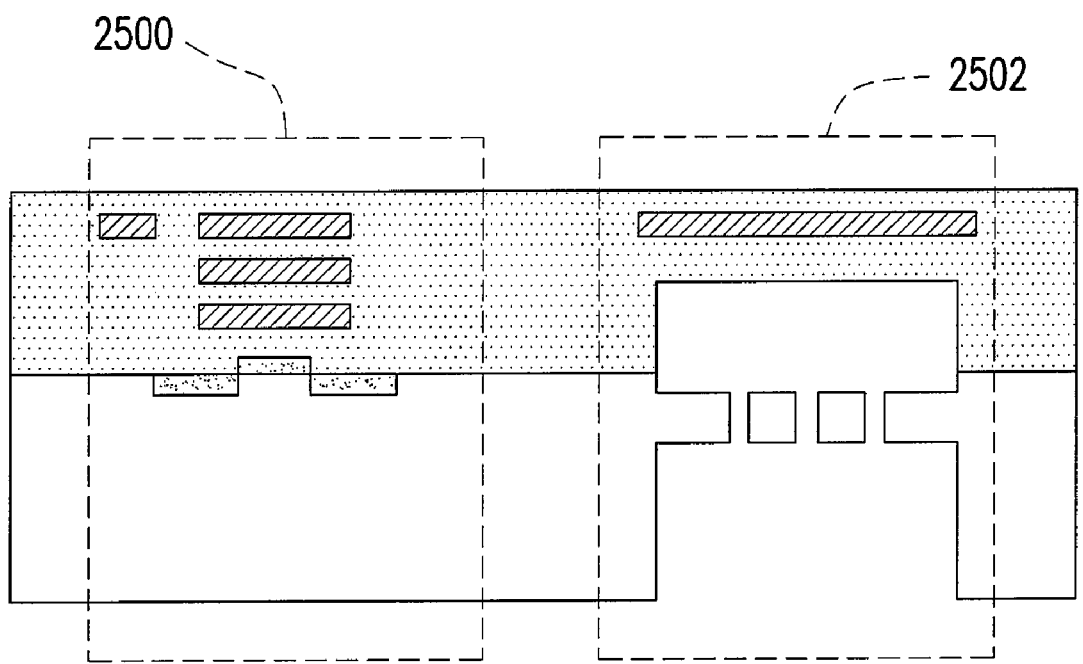
FIG. 1 is a cross-sectional view, schematically illustrating a semiconductor MEMS device, according to an embodiment of the invention.

FIG. 1 is a cross-sectional view, schematically illustrating a semiconductor MEMS device, according to an embodiment of the invention. In FIG. 1, for the more general structure, the usual MOS device 2500 is formed at one region of the substrate while the MEMS device 2502 of the invention is formed at another region of the same substrate. As a result, the MEMS device can be fabricated by the semiconductor process without confliction. The present invention uses the etching stop layer to allow the substrate can be patterned for the MEMS device from the backside of the substrate. The MEMS device is integrated into the single chip. The conventional technology needs to form the MEMS device, separately, and then the two device pieces are assembled together by the packaging process. For example, the MEMS device 2502 can be used to form a microphone as the example. However, the MEMS device can also be used in other various applications, such as MEMS speaker, MEMS accelerometer, MEMS gyroscope.

Figure 2:
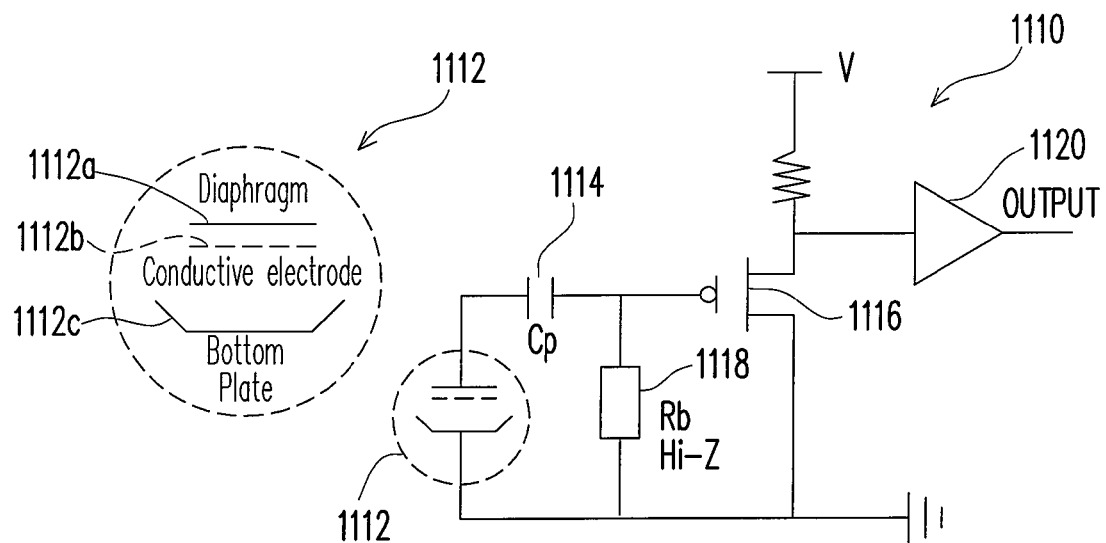
FIGS. 2-3 are circuits diagrams, schematically illustrating a CMOS circuit implemented with MEMS device, according to embodiments of the invention.
Figure 3:
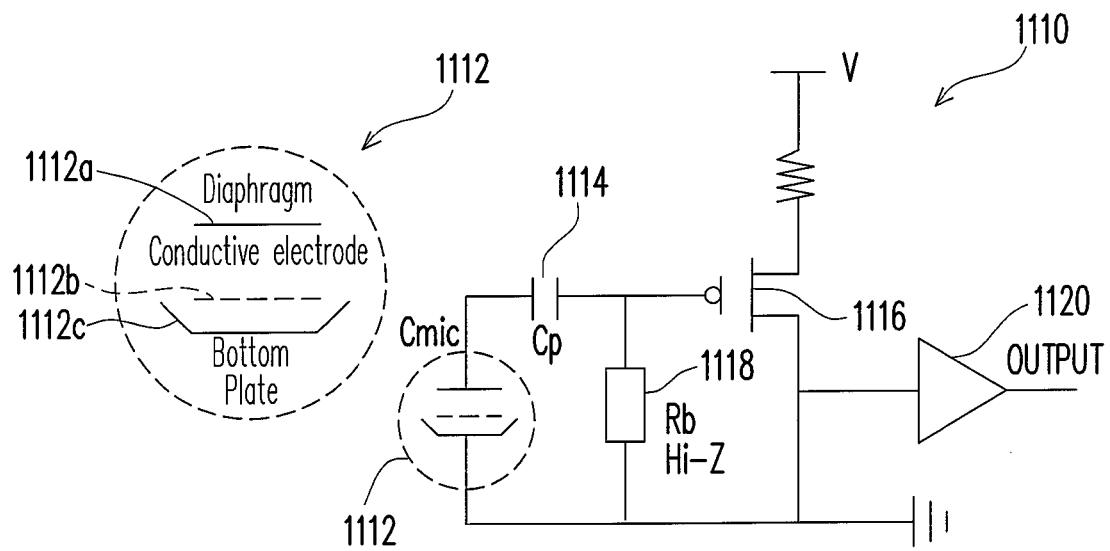

FIGS. 2-3 are circuits diagrams, schematically illustrating a CMOS circuit implemented with MEMS device, according to embodiments of the invention. In FIG. 2, the CMOS circuit 1110 is implemented with MEMS device 1112. The circuit of the CMOS 1110 also includes the capacitor 114, resister 1118, MOS transistor 1116, and amplifier 1120. The MEMS device 1112, serving as a capacitor, is connected in parallel with the resistor 1118. The MEMS device 1112 has a desired amount of charges by pre-charging process or provide by a constant voltage, so as to sense the sound pressure or external force in the form of voltage signal through the MEMS device 1112. The MEMS device 1112 basically includes a diaphragm 1112a to detect the sound vibration or external force. A charged conductive electrode 1112b has the charges and is carried by diaphragm 1112a in vibrating with the sound. The bottom plate 1112c with the conductive electrode 1112b forms a capacitor. When the diaphragm 1112a vibrate in accordance with the sound pressure or force, the capacitance of the MEMS device 1112 is accordingly changed, and then since the constant charges is existing, the voltage signal in accordance with the sound pressure or force is produced.

In FIG. 2, the conductive electrode 1112b is carried by the diaphragm 1112a. However in FIG. 3, the charged conductive electrode 1112b can be alternatively implemented on the bottom plate 1112c. The operation mechanism is the same as that in FIG. 2. The MEMS device 1112 can be fabricated by the semiconductor fabrication process when a proper etching stop layer is used. As a result, the bottom plate can be, for example, a silicon substrate, and can be patterned and/or formed with the desired semiconductor device thereon. Before describing the MEMS structure, the pre-charging operation to the charged conductive electrode 1112b is described as follows.

Figure 4:
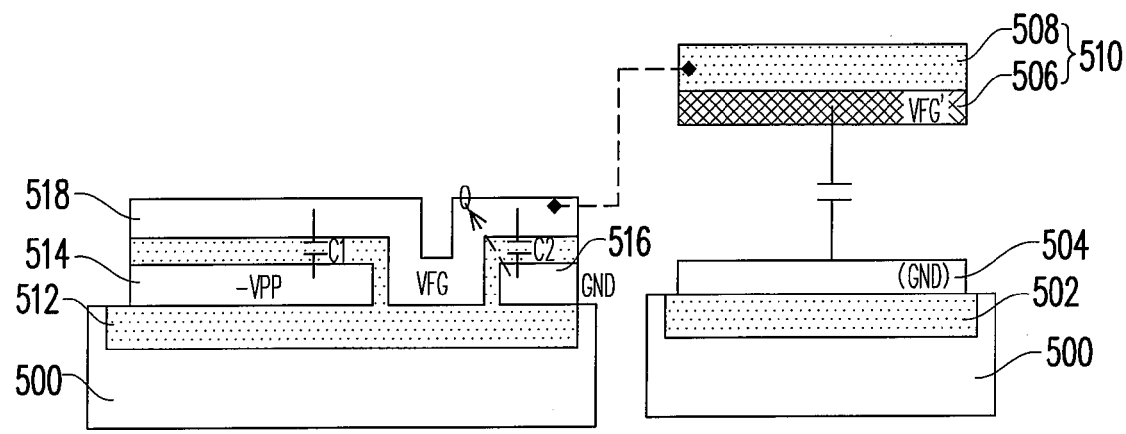

In FIG. 4, taking the example that the diaphragm 510 having the charged conductive electrode 508 and etch stop layer 506, a capacitor is formed between the charged conductive electrode 508 and the ground electrode 504. The ground electrode 504 is formed over the substrate 500 and isolated by the dielectric layer 502. The external charging circuit can also be formed over the dielectric layer 512 of the substrate 500 with the electrodes 514, 516 and 518, to have two capacitors C1 and C2. Due to the corner charging mechanism, the charges with the voltage VGF' can be applied to the charged conductive electrode to store the desired amount of charges. As a result, the MEMS is programmed with the charges.

Figure 5:
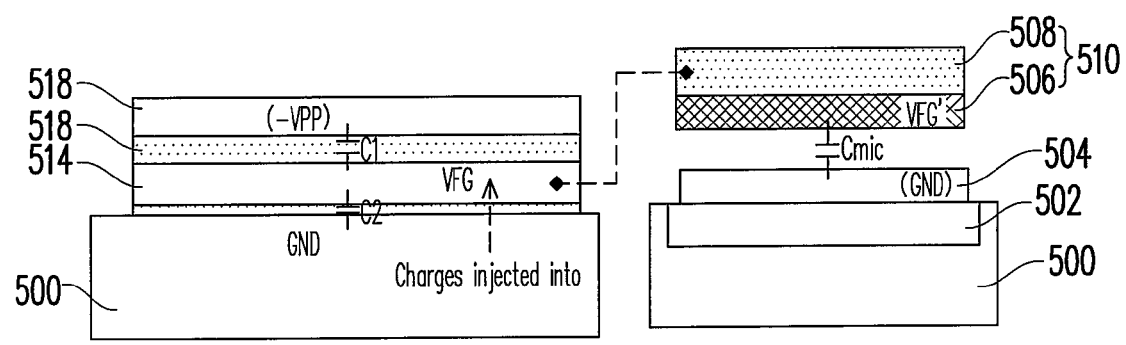

In FIG. 5, the external charging circuit can also be designed by the charge injection mechanism. The charges are injected to the electrode layer 514, and then are applied to the charged conductive electrode 508.

The charged conductive electrode can be like a nonvolatile memory device, which stores the charges. In FIG. 6, the diaphragm 616 is, for example a metal electrode of the capacitor 600 while the substrate 602 has the dielectric layer 604 and the charge storage device over the dielectric layer 604. The lower electrode 606, such as polysilicon or metal layer, serves a ground electrode. The charge storage device, such as the oxide 608/nitride 610/oxide 612 (O/N/O) structure, can be formed between the high voltage electrode 614, such as polysilicon layer or metal layer, and the ground electrode 606.

In FIG. 7, alternatively, the ground electrode 606 in FIG. 6 can be, for example, formed in the substrate by a doped well structure. In FIG. 7, the doped well 702 is formed in the substrate 700. The (O/N/O) structure (704-708) is formed over the doped well 702, in which the substrate is at ground. Then, the charged in the doped well 702, such as N-type well, can be injected into the nitride layer 706. In associating with the metal diaphragm 712, a MEMS device capacitor 720 can be, for example, formed.

In FIG. 8, alternatively, a floating conductive electrode structure 806, such as the floating polysilicon, can be formed over the doped well 802 of the substrate 800. The floating electrode 806 is surrounded with, for example, the oxide layer 804 and the etching stop layer 808. The etching stop layer 808 is used in etching process for forming the device and can prevent the damage of the device during forming the chamber.

As a result, the charge is injected into the floating electrode 806. In order to form the MEMS capacitor 820, the diaphragm 810 can also be, for example, a metal electrode, to serve as the top electrode.

In the following descriptions, several MEMS structures are described as the examples. However, the present invention is not limited to the examples. In addition, the examples can also be properly combined to each other. FIGS. 9-48 are cross-sectional views, schematically illustrating the structures of the MEMS device, according to embodiments of the invention.

Figure 9:
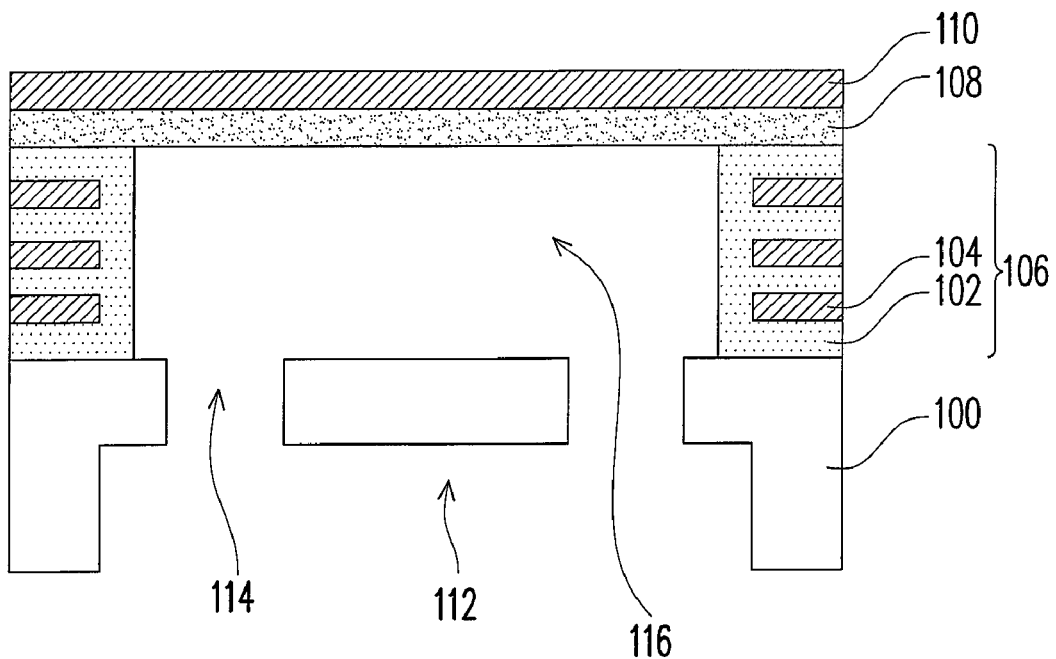
FIGS. 9-48 are cross-sectional views, schematically illustrating the structures of the MEMS device, according to embodiments of the invention.

In FIG. 9, a dielectric structural layer 106 can be formed over a substrate 100. The dielectric structural layer 106 includes the dielectric layer 102. Depending on the circuit at the other region of the substrate 100, the dielectric structural layer 104 may have the embedded conductive layer 104. An etching stop layer 108 is formed over the dielectric structural layer 106, a conductive electrode layer 110 is formed over the etching stop layer 108. Here, due to the function from the etching stop layer 108, the substrate can be patterned to have cavity 112 and the venting hole 114. The dielectric structural layer 106 has an opening, which serves as a chamber 116. The conductive layer 110 and the etching stop layer 108 together serving as the diaphragm. In other words, the conductive electrode layer 110 is adapted in the diaphragm. When the diaphragm is vibrating with the sound pressure or force, the capacitance is changed, and then the voltage is changed. The air in the chamber 116 can flow in and out the cavity through the venting hole 114.

Figure 10:
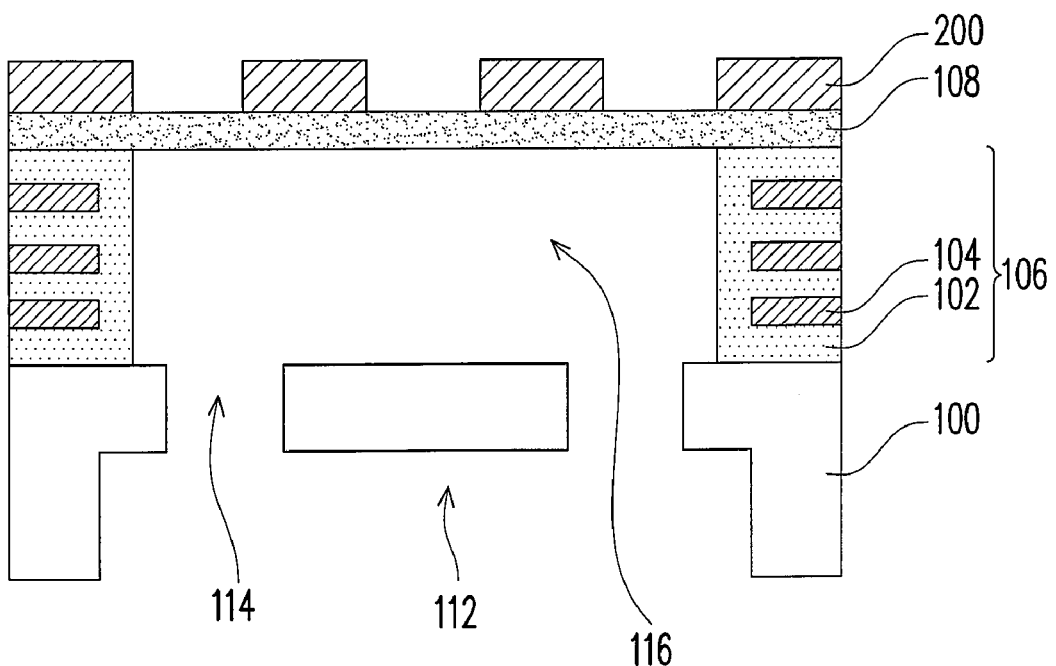

Alternatively, the conductive electrode layer 110 in FIG. 9 can be further patterned. In FIG. 10, the conductive electrode layer 200 is disposed over the etching stop layer 108 with some opening to expose the etching stop layer. The etching stop layer 108, such as the amorphous silicon, Polysilicon, Metal layer or nitride layer, the conductive electrode layer 200 can be patterned by the usual semiconductor fabricating process. The material of the conductive electrode layer 100, 200 can include, for example, polysilicon, metal, or composite metal layer. The material for the etching stop layer 108 can be the option to have the etching selectivity in etching process.

Figure 11:
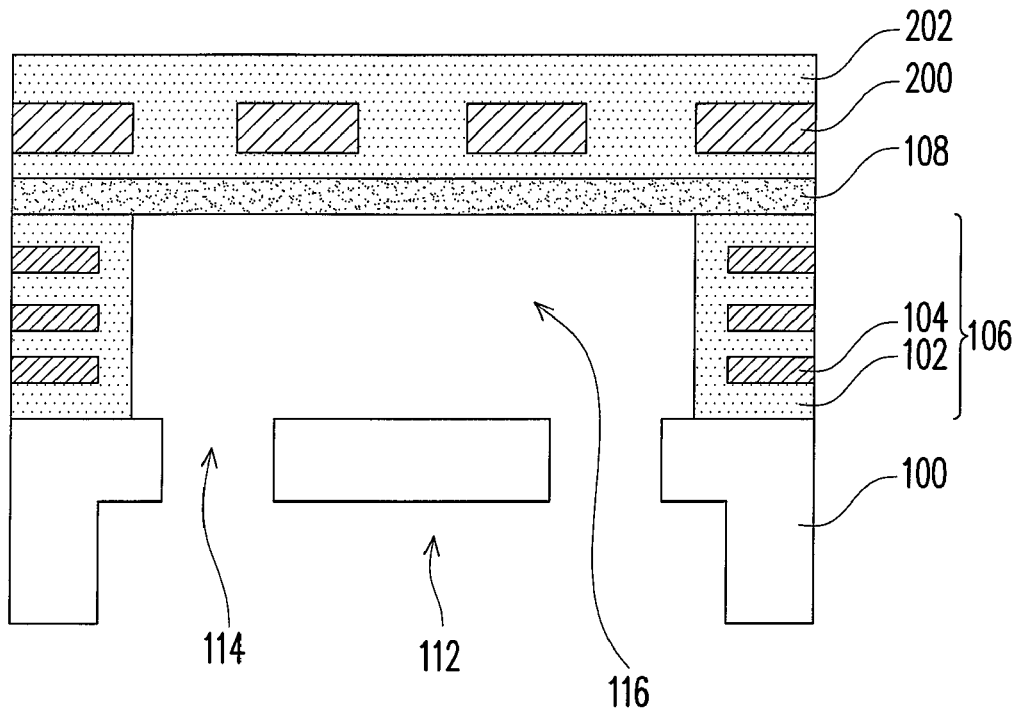
Figure 12:
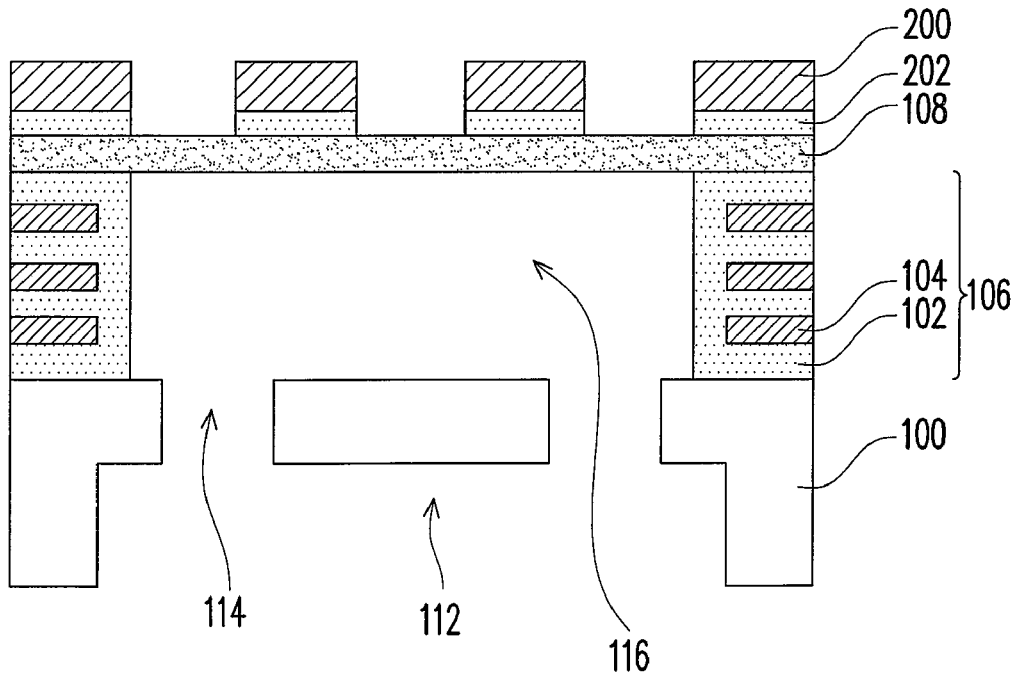

In FIG. 11, alternatively, based on the different fabrication process, the dielectric layer 202 can be formed over the etching stop layer and the conductive layer 200 is embedded in the dielectric layer 202, which can be formed with multiple dielectric layers to adapt the conductive layer 200 by the photolithographic and etching processes. The dielectric layer 202 and the etching stop layer 108 adapt the conductive electrode layer 200 to serve as a diaphragm in responding to sound pressure and force. In FIG. 12, further alternatively, the dielectric layer 202 is not necessary to surround the conductive electrode layer 200. Instead, the dielectric layer 202 and the conductive electrode layer 200 are etched to expose the etching stop layer 108.

Figure 13:
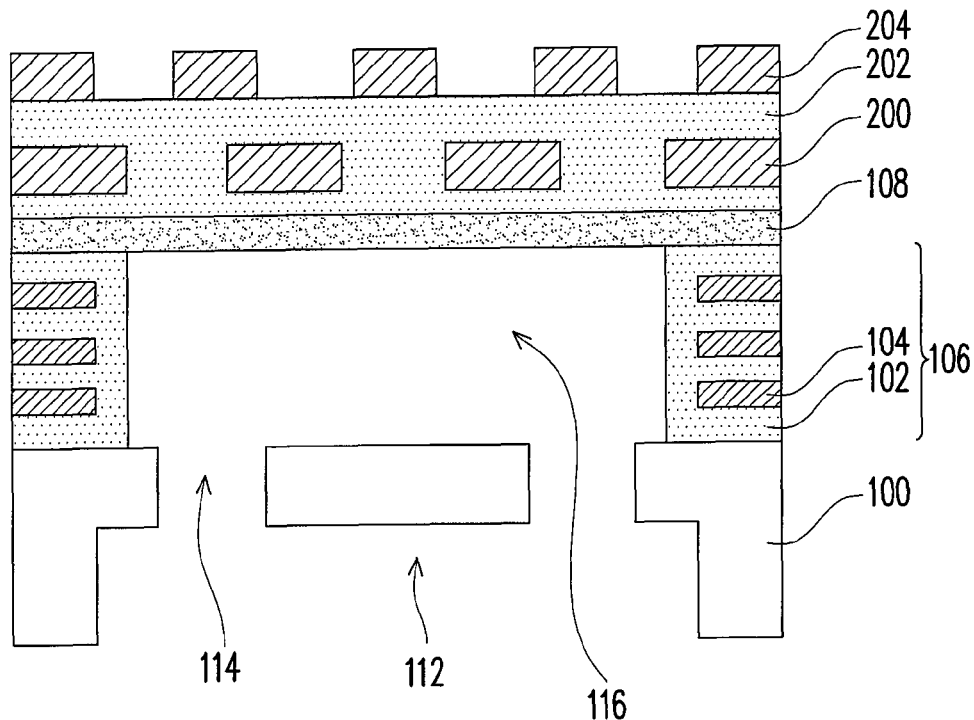

In FIG. 13, based on the structure in FIG. 11, another conductive layer 204 can be, for example, further formed over the dielectric layer 202. The conductive layer 204 can be further used to adjust the stored charges, depending on the design option.

Figure 14:
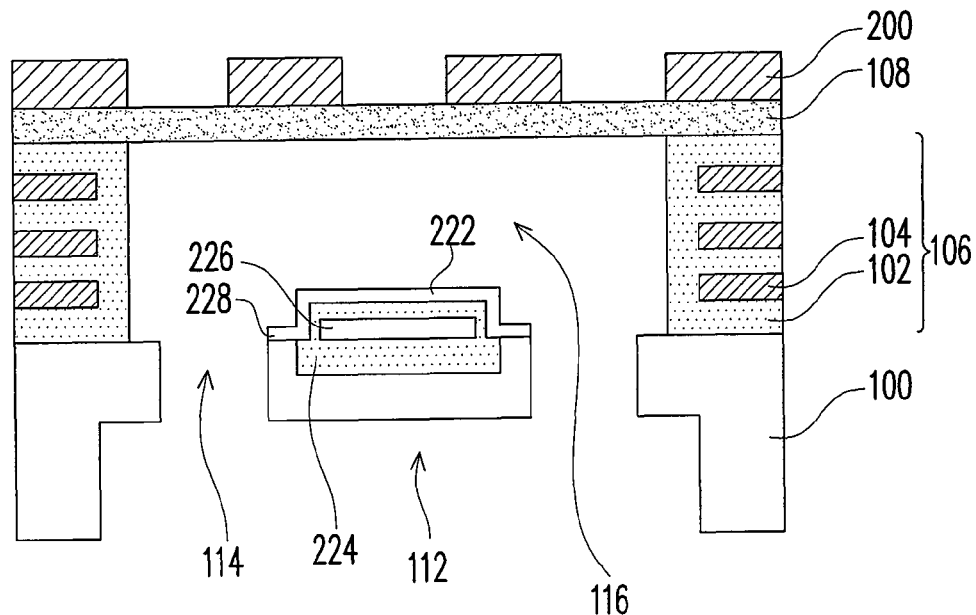

In FIG. 14, additionally, constant charges can be formed on the substrate 100 by the charged conductive electrode on the bottom plate. The conductive electrode layer 200 over the etching stop layer 108 can be any proper structure. Here, the conductive electrode layer 200 is disposed on the etching stop layer 108, as the example. However, the charged conductive electrode structure 228 can be, for example, formed over the substrate 100. The charge storage structure 228 includes, for example, a dielectric layer 224, such as the oxide layer, over the substrate 100. A conductive layer 226 is embedded in the dielectric layer 224. An etching stop layer 222 is disposed over the dielectric layer 224 to form the charged conductive electrode structure 228. Material of the conductive layer 226 can be for example Polysilicon, or Metal layer. The charge can be stored in the charged conductive layer 226 after programmed. Alternative way the constant charge is provided by a constant voltage is applied between the conductive layer and Substrate. Here, the etching stop layer 222 can protect the charge storage structure 228 when the chamber 116 is formed by etching the dielectric layer 102, such as the oxide layer.

Figure 15:
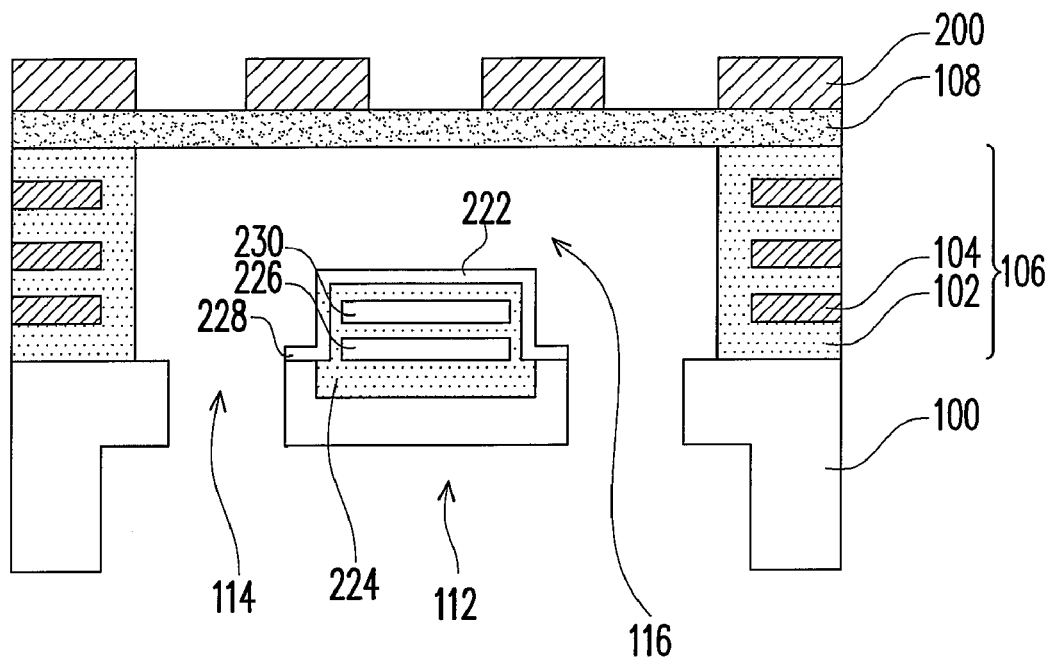

Alternatively in FIG. 15, the charge storage structure 228 can also be formed with dual conductive layer. In other words, for example, another polysilicon or metal layer 230 can be additionally embedded in the dielectric layer 224. It should be noted that the charged conductive electrode structure 228 is just the example. Actually, a semiconductor device can be form over the substrate in associating with the diaphragm.

Figure 16:
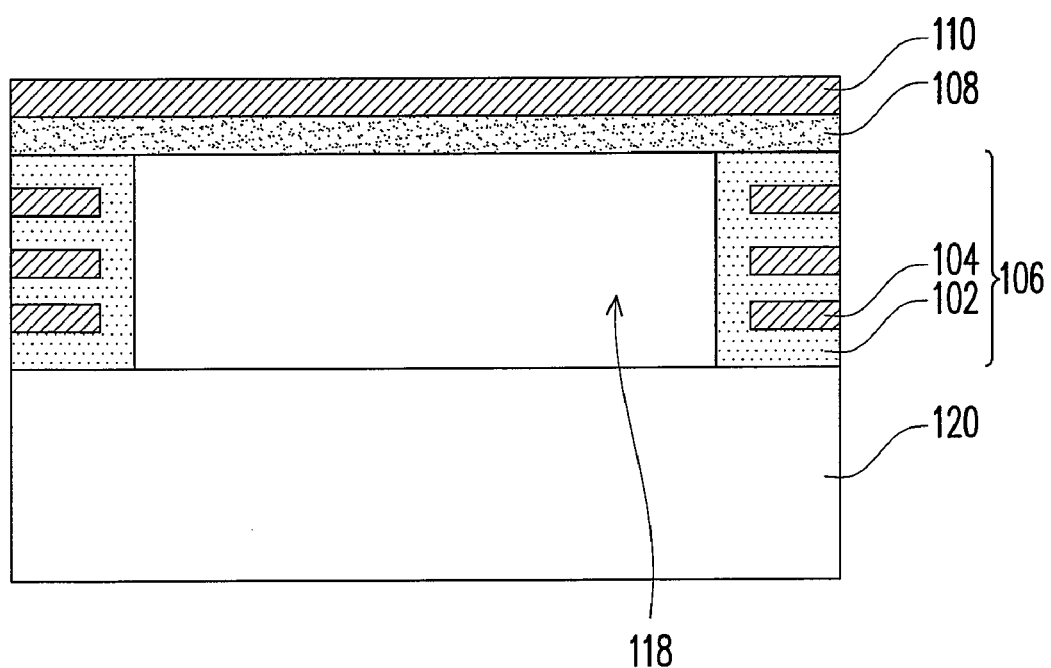

In FIG. 16, alternatively, the substrate 120 is not necessary to form the cavity and the venting hole at the region under the chamber 118, as shown in FIG. 9. In this situation, the dielectric structural layer 106 remains. The etching stop layer 108 and the conductive electrode layer 110 are sequentially formed over the dielectric structural layer 106.

Figure 49A:
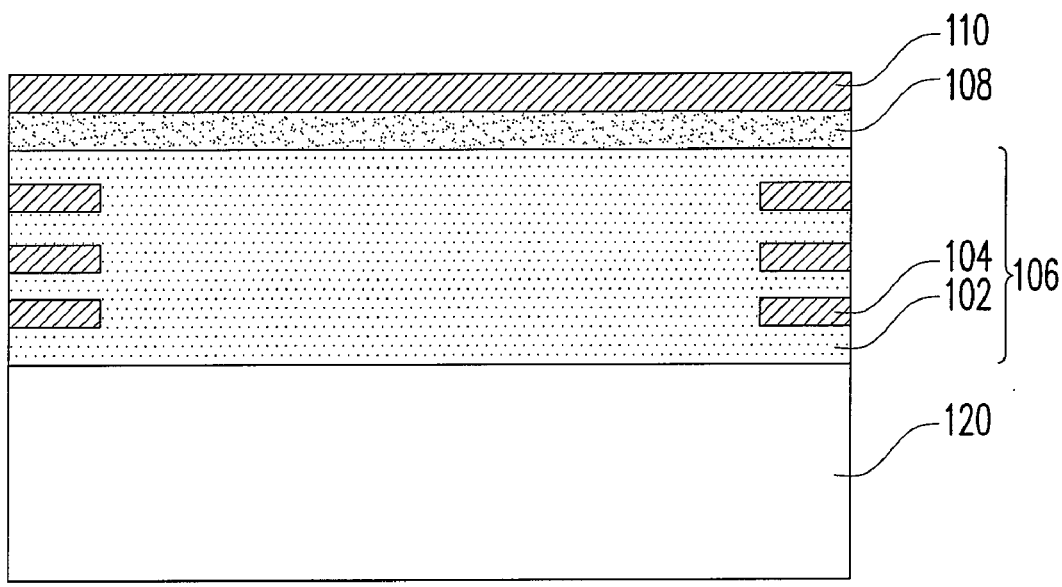
FIGS. 49A-49C are cross-sectional views, schematically illustrating the fabrication process to form the chamber, according to an embodiment of the invention.
Figure 49B:
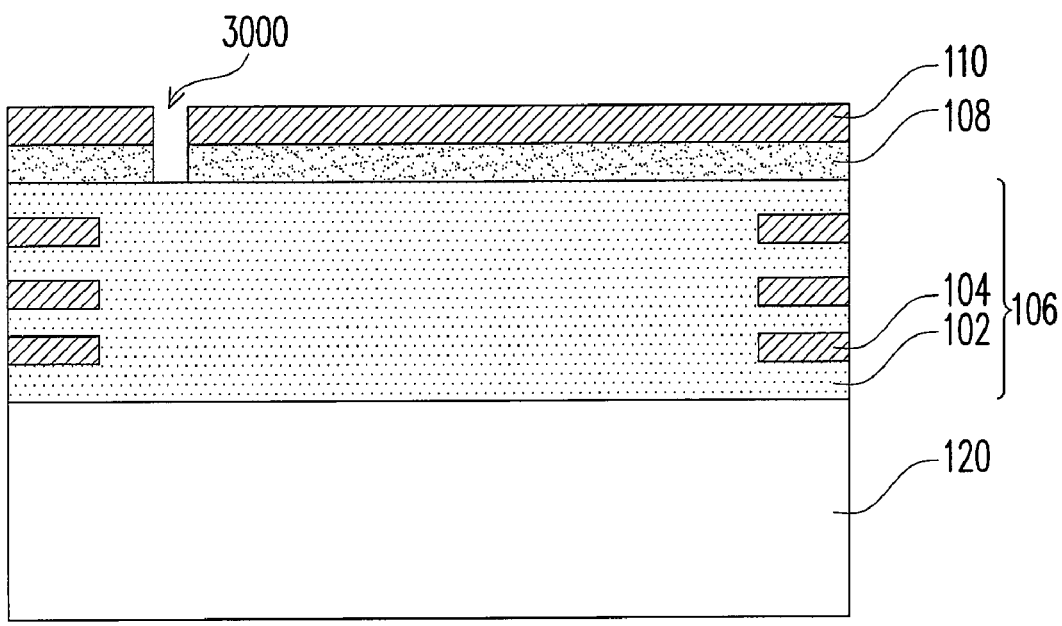
Figure 49C:
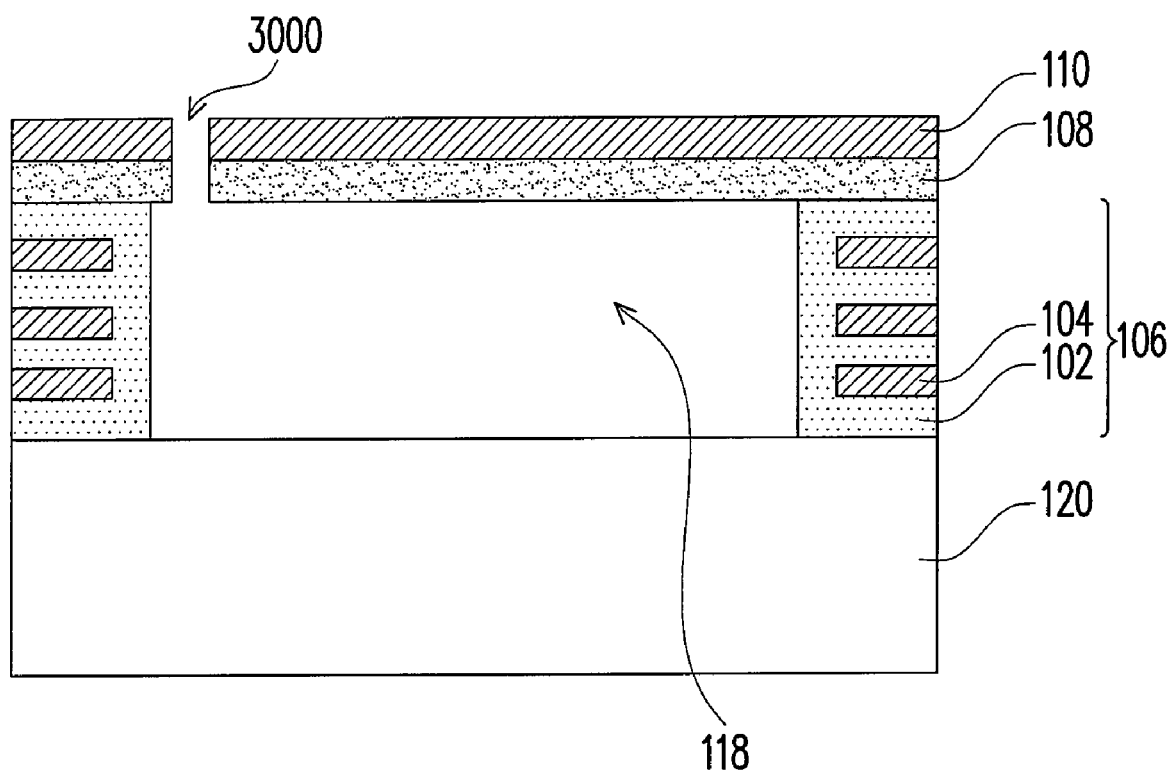

In order to form the chamber 118 without venting hole in the substrate 120, a different process can be performed. FIGS. 49A-49C are cross-sectional views, schematically illustrating the fabrication process to form the chamber, according to an embodiment of the invention. In FIG. 49A, at the other cross-sectional view from the view in FIG. 16, the conductive electrode layer and the etching stop layer are formed but the chamber is not formed yet. In FIG. 49B, an opening 3000 through the etching stop layer and the conductive electrode layer at a proper position within the desired chamber region can be formed to expose the dielectric structural layer 106. In FIG. 49C, a portion of the dielectric structural layer 106 is etched by the etching process with the opening 3000. As a result, the chamber 118 can be formed. The process can be applied to any embodiment described later to form the chamber without forming the venting hole in the substrate.

Figure 50A:
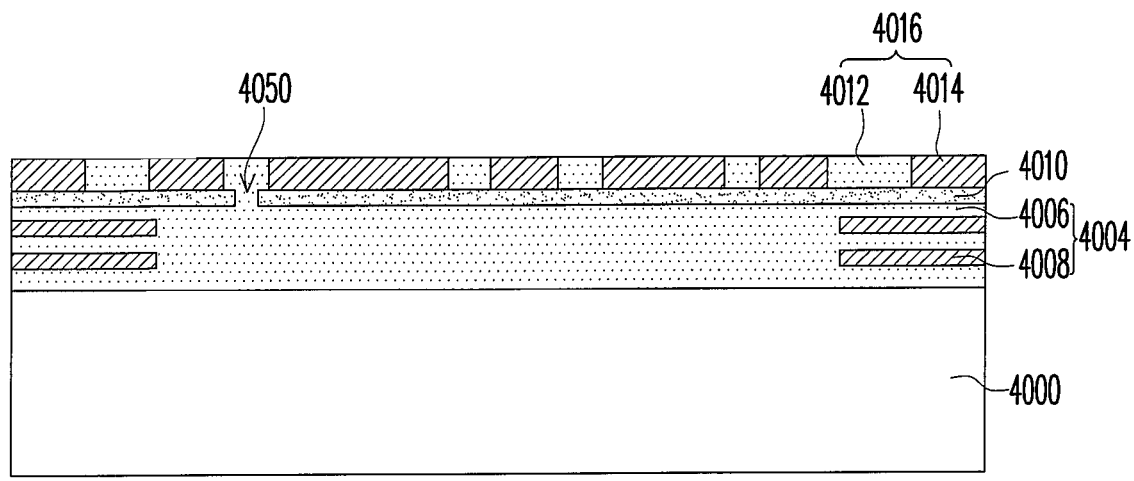
FIGS. 50A-50B are cross-sectional views, schematically illustrating the fabrication process to form the chamber, according to an embodiment of the invention.
Figure 50B:
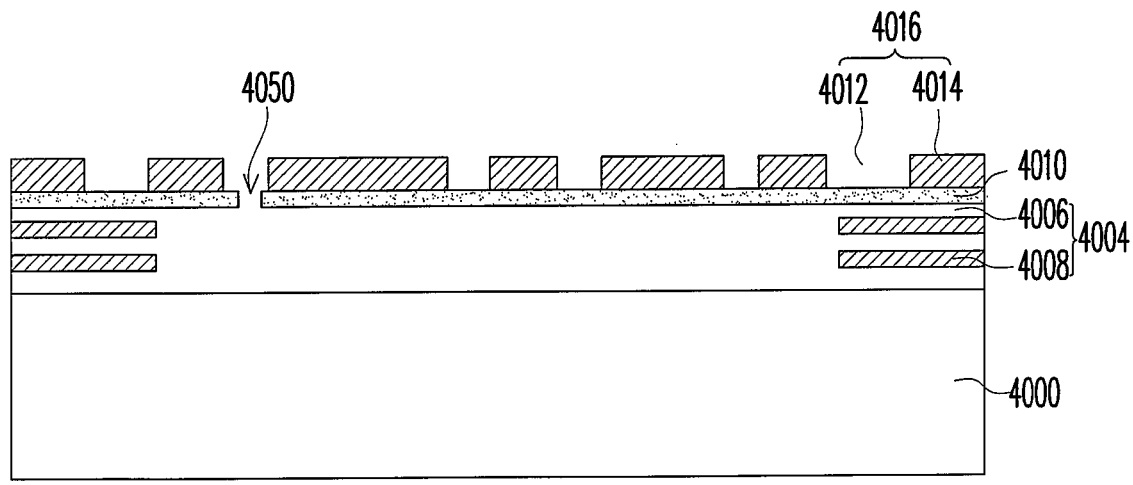

Alternative fabrication process to form the chamber 118 without venting hole in the substrate 120 can be performed. FIGS. 50A-50B are cross-sectional views, schematically illustrating the fabrication process to form the chamber, according to an embodiment of the invention. In FIG. 50A, the dielectric structural layer 4004 includes the dielectric layer 4006 and may also have the embedded conductive layer 4008 over a substrate 4000. In this embodiment, the etching stop layer 4010 and the conductive electrode structure 4014 may be further formed over the dielectric layer 4006. The dielectric layer 4012 can be the same material as the dielectric layer 4006. It can be noted that an opening pattern 4050 exists in the patterned etch stop layer 4006 which is not covered by the patterned conductive electrode structure layer 4014. In FIG. 50B, a portion of the dielectric structural layer 4006 is etched through the opening 4050 by, for example, isotropic dry etch or vapor HF etch. As a result, the chamber 4026 can be formed. The process can be applied to any embodiment described later to form the chamber without forming the venting hole in the substrate.

Figure 17:
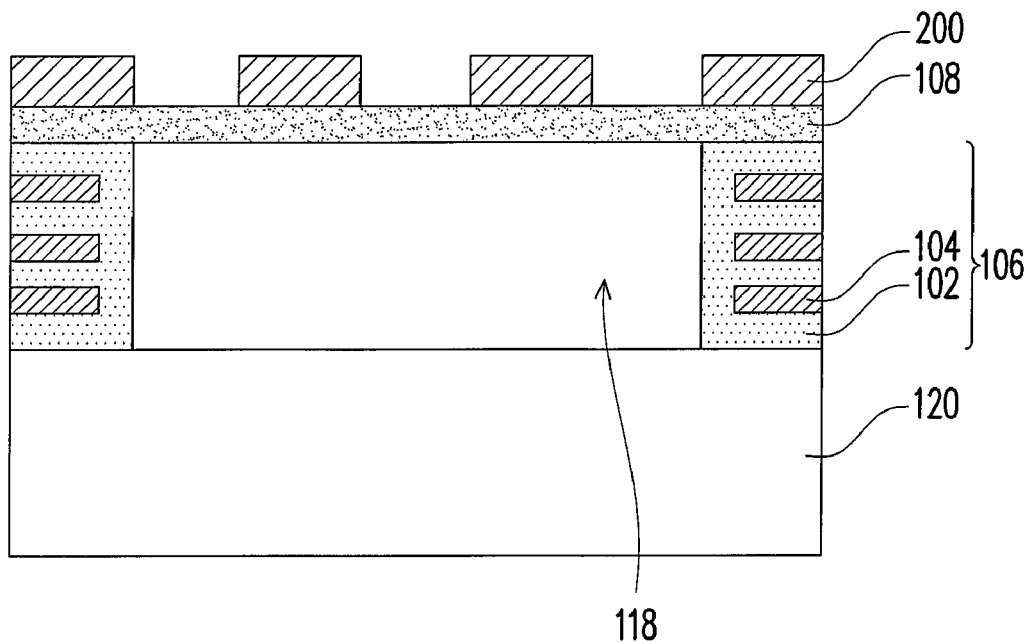
Figure 18:
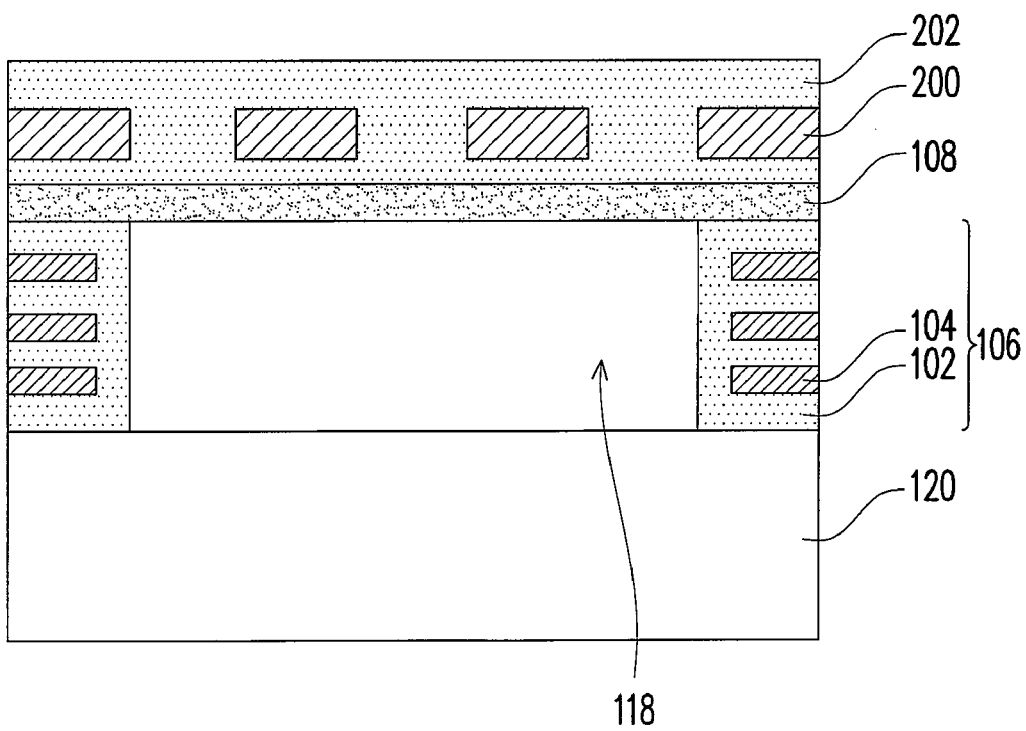
Figure 19:
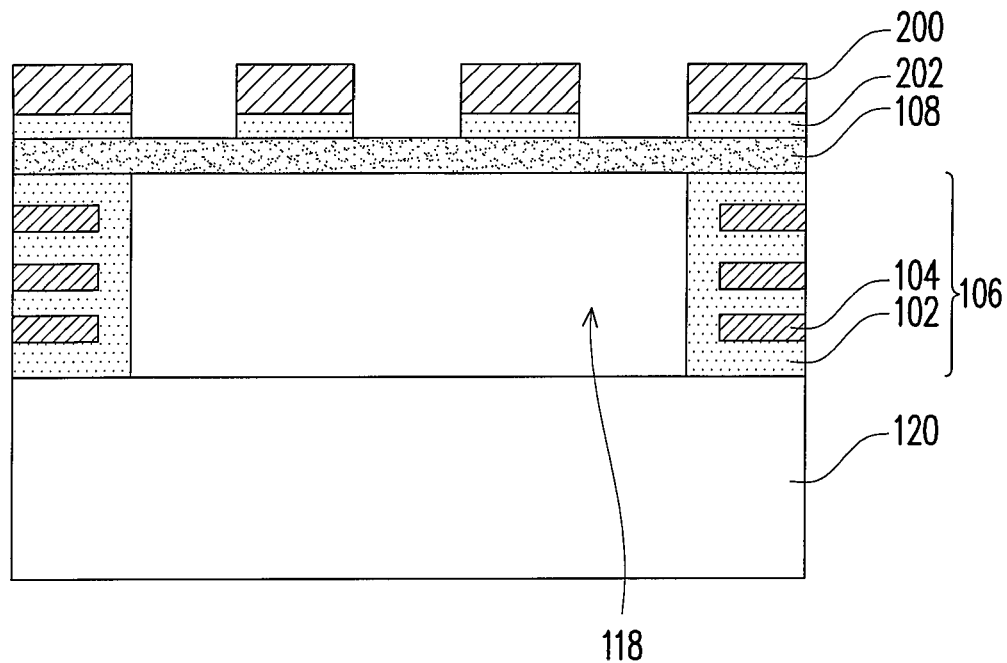
Figure 20:
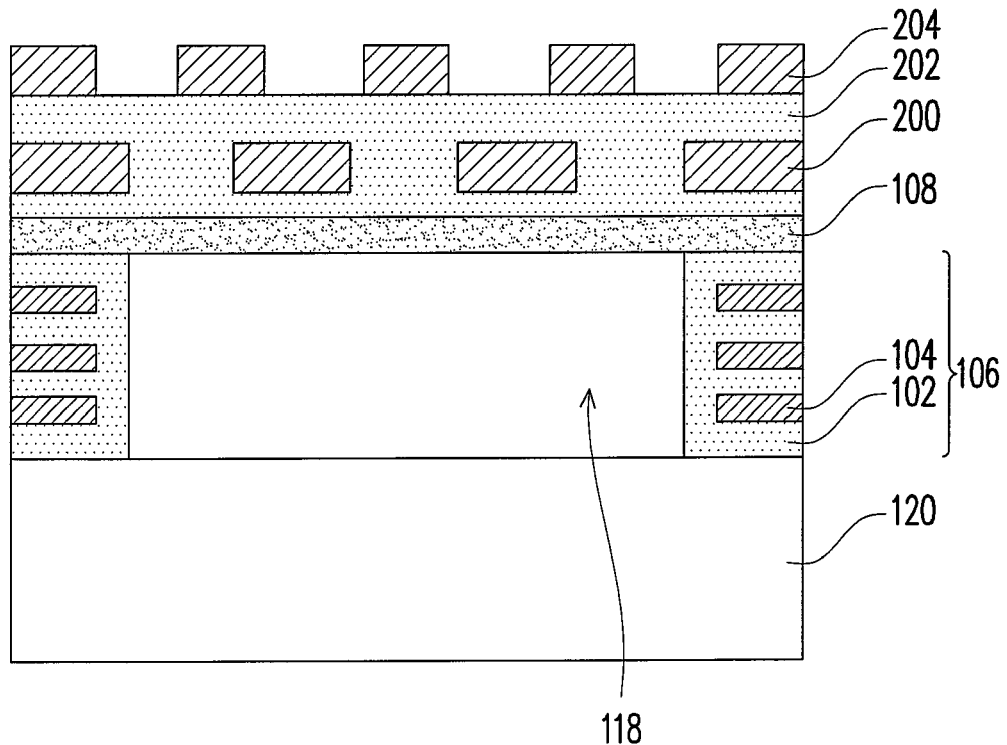

Like the structures described in FIGS. 9-13, in this example of FIG. 17, the conductive electrode 200 is formed over the etching stop layer 108 and exposes a portion of the etching stop layer 108. In FIG. 18, the conductive electrode layer 200 is embedded in the dielectric layer 202. In FIG. 19, the dielectric layer 202 is disposed between the conductive electrode layer 200 and the etching stop layer 108 in the same pattern. In FIG. 20, the additional conductive layer 204 is formed over the dielectric layer 202. Here, as being described in FIGS. 49A-49C or FIGS. 50A-50B, the process can be performed to form the chamber 118.

Figure 21:
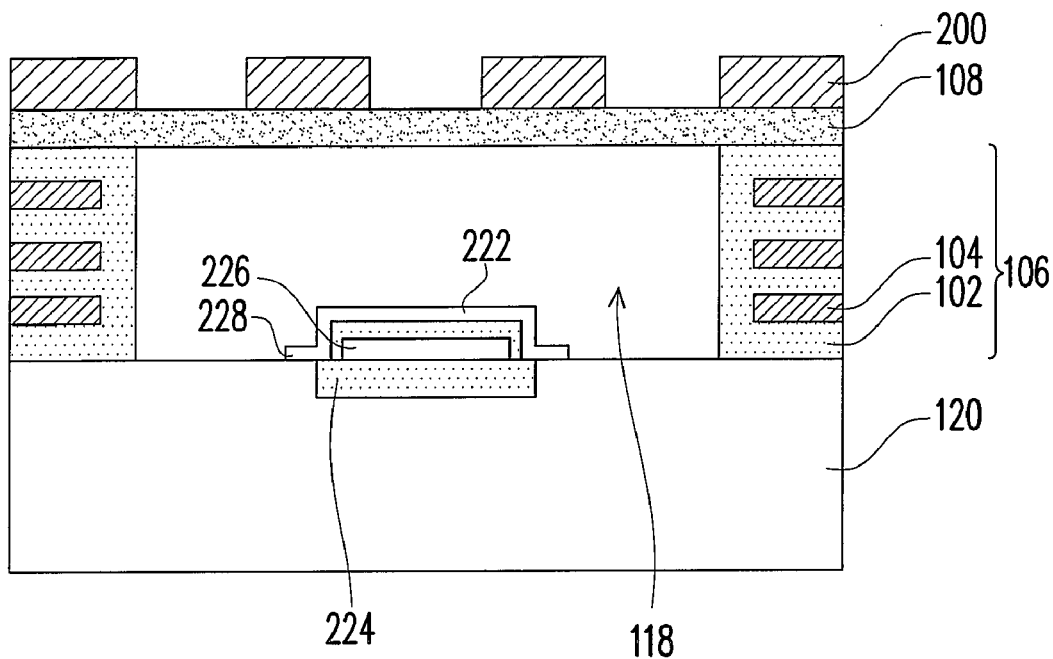
Figure 22:
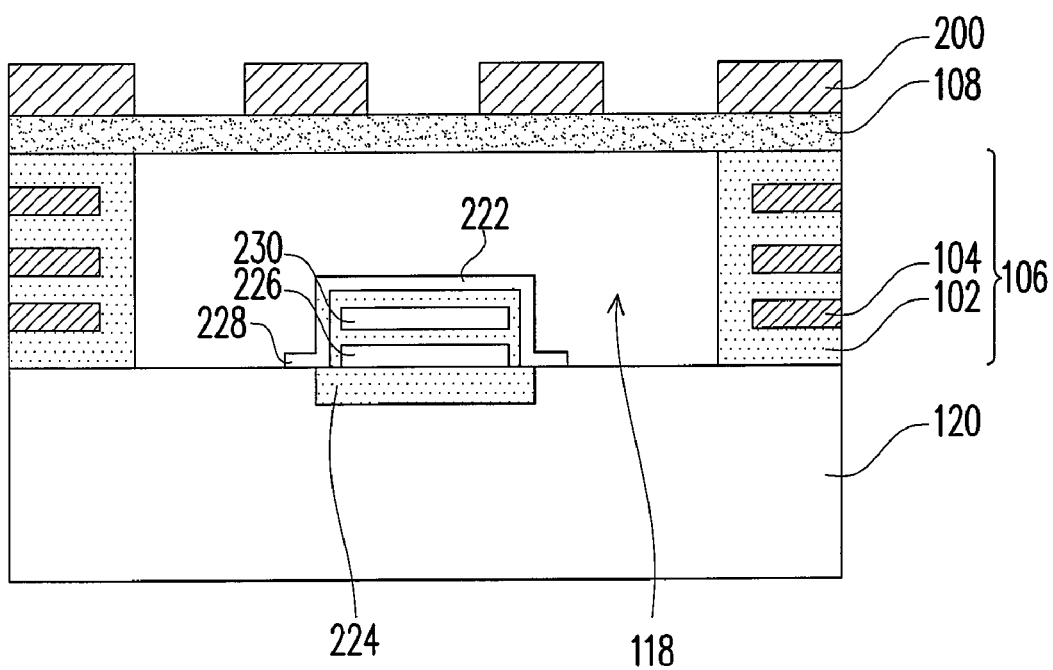

Like the structures over the substrate shown in FIGS. 14 and 15, in FIG. 21, the conductive electrode layer 200 is disposed on the etching stop layer 108, as the example. However, the charged conductive electrode structure 228 can be formed over the substrate 120. The charged conductive electrode structure 228 includes, for example, a dielectric layer 224, such as the oxide layer, over the substrate 100. A conductive layer 226 is embedded in the dielectric layer 224. An etching stop layer 222 is disposed over the dielectric layer 224 to form the charge storage structure 228. Material of the conductive layer 226 can be for example Polysilicon, or Metal. In FIG. 22, the charged conductive electrode structure 228 can further include another conductive layer 230.

Figure 23:
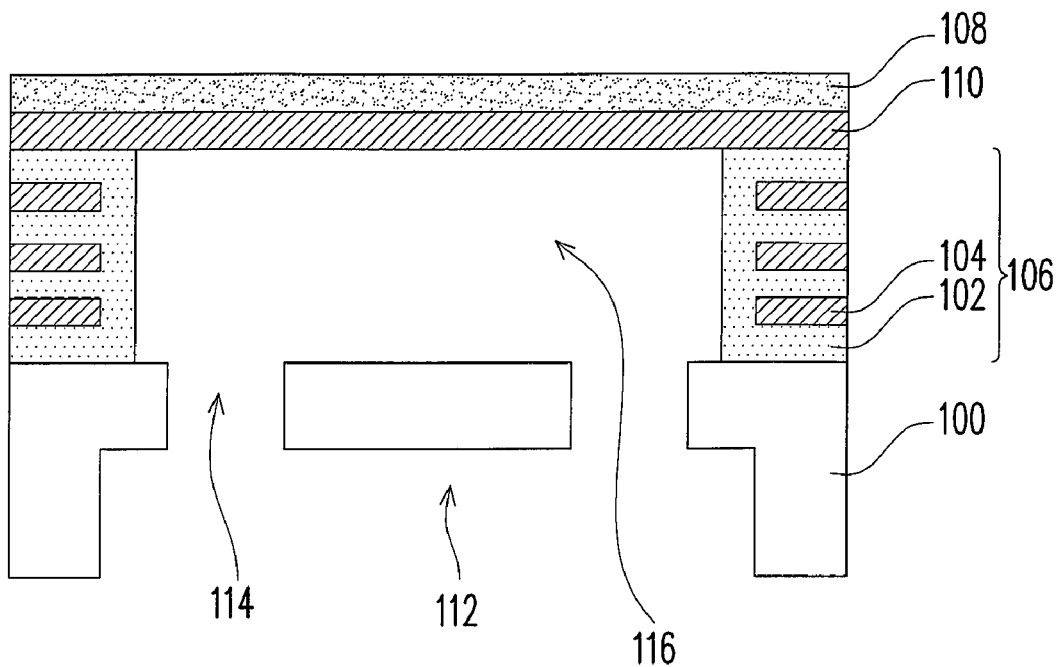

Alternatively, in FIG. 23, the conductive electrode layer 110 can be formed over the dielectric structural layer 106 and the etching stop layer 108 is formed over the conductive electrode layer 110. In comparing with FIG. 9, the positions of the conductive electrode layer 110 and the etching stop layer 108 are reverse.

Figure 24:
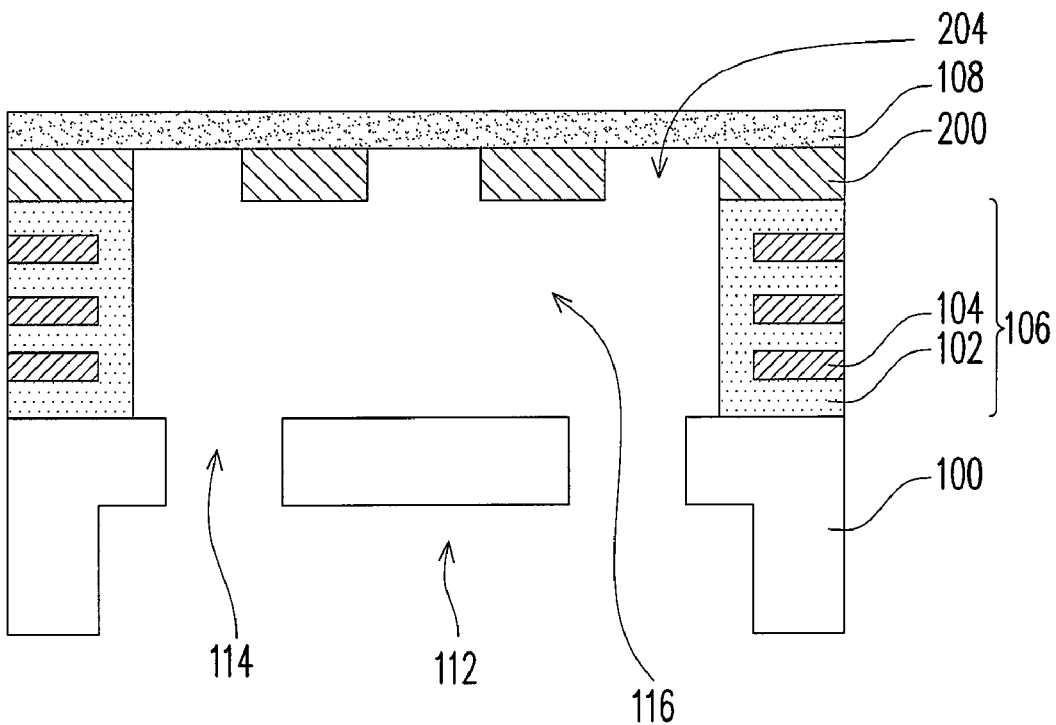

Alternatively in FIG. 24, the conductive electrode layer 200 may have the pattern and can be formed together with the dielectric structural layer 106. The etching stop layer 108 in etching process allows the chamber 116 to be formed. As a result, the conductive electrode layer 200 has the opening 204 to expose the etching stop layer.

Figure 25:
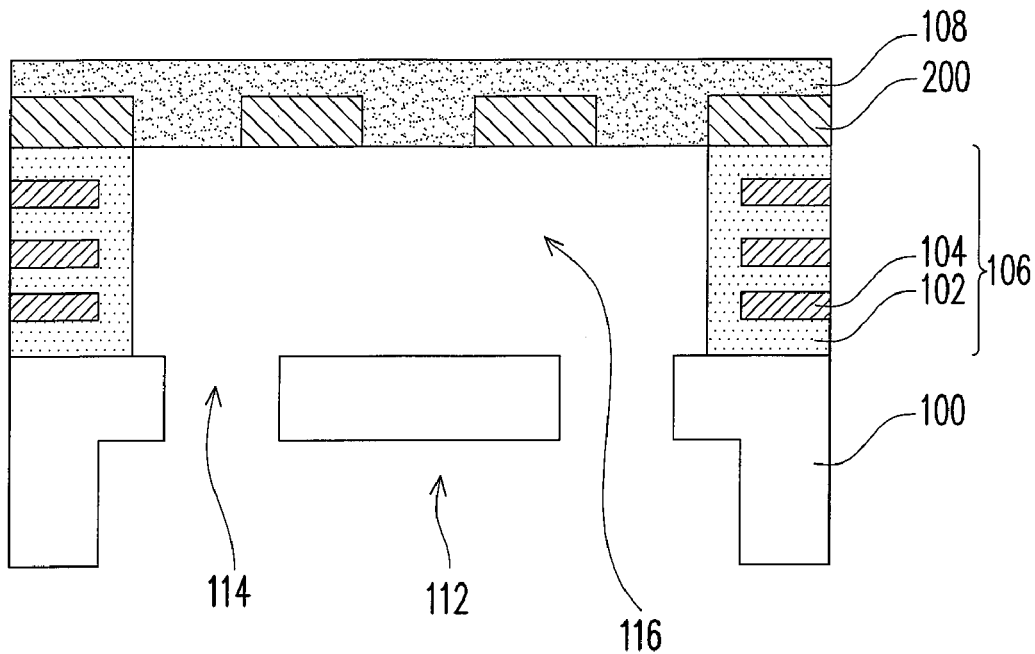

In FIG. 25, the etching stop layer 108 can be, alternatively, filling the opening 202 of the conductive electrode layer 200. As a result, when the etching process to form the chamber 116, the chamber 116 expose the etching stop layer 108 and the conductive electrode layer 200.

Figure 26:
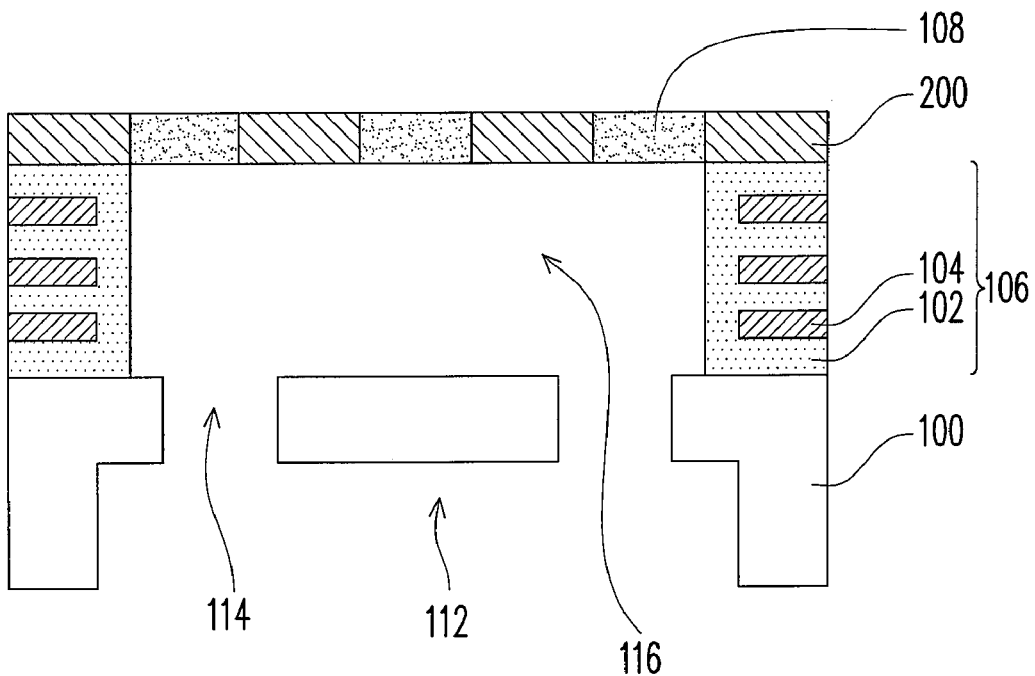

In FIG. 26, even further in another example, the etching stop layer 108 can be, for example, planarized to the height of the conductive electrode layer 200. The diaphragm is then thinner and is another design option.

Figure 27:
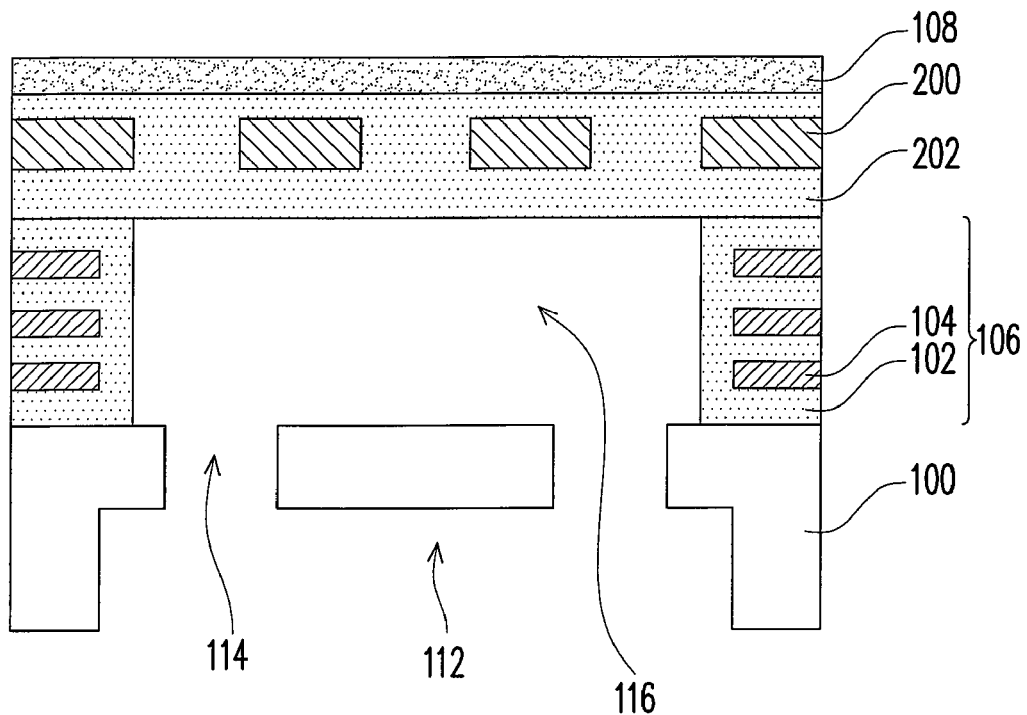

In FIG. 27, in comparing with FIG. 11, the position of the etching stop layer 108 is over the dielectric structural layer 202. In this situation, the dielectric layer 202 can be, for example, the same material as the dielectric later 102. However, it can also be different in material.

Figure 28:
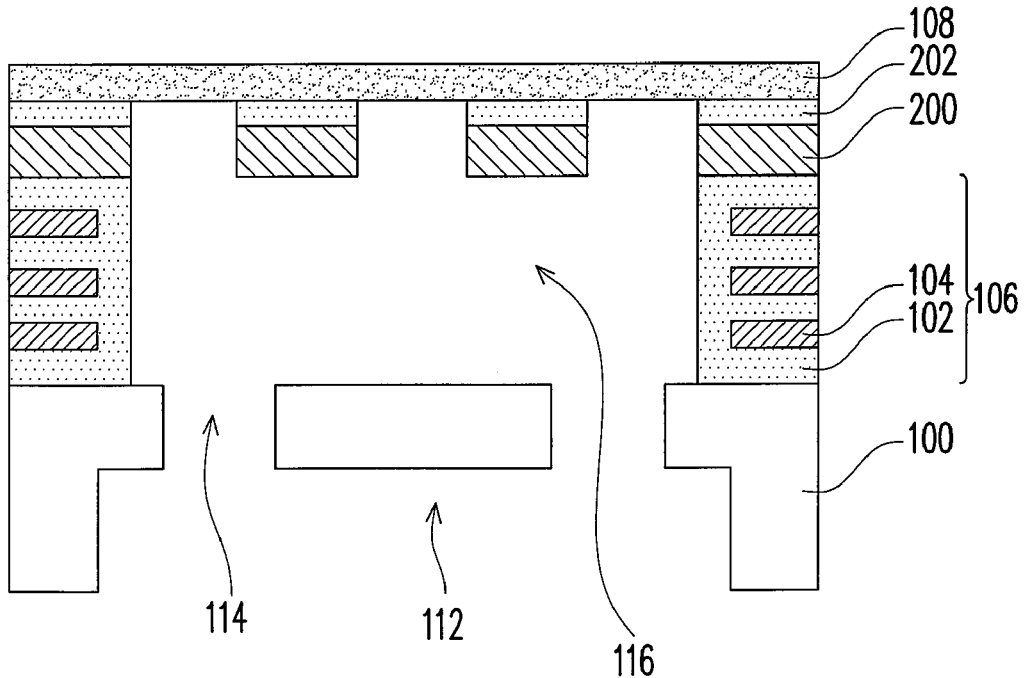

In FIG. 28, likewise in comparing with FIG. 12, the dielectric layer 202 is also patterned with the conductive electrode layer 200.

Figure 29:
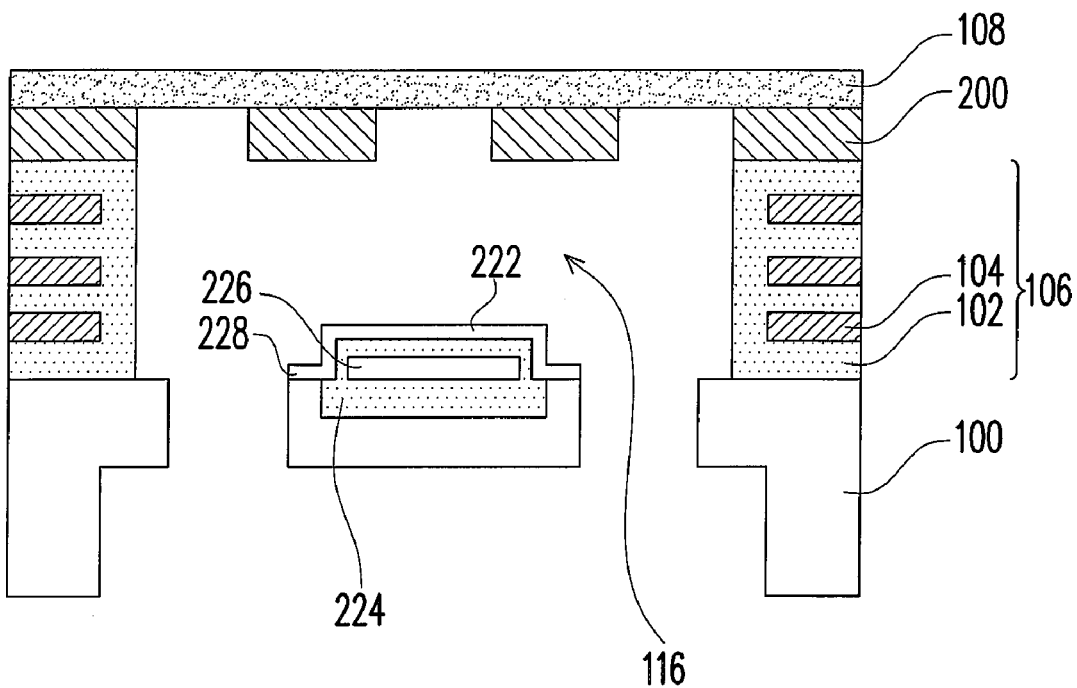
Figure 30:
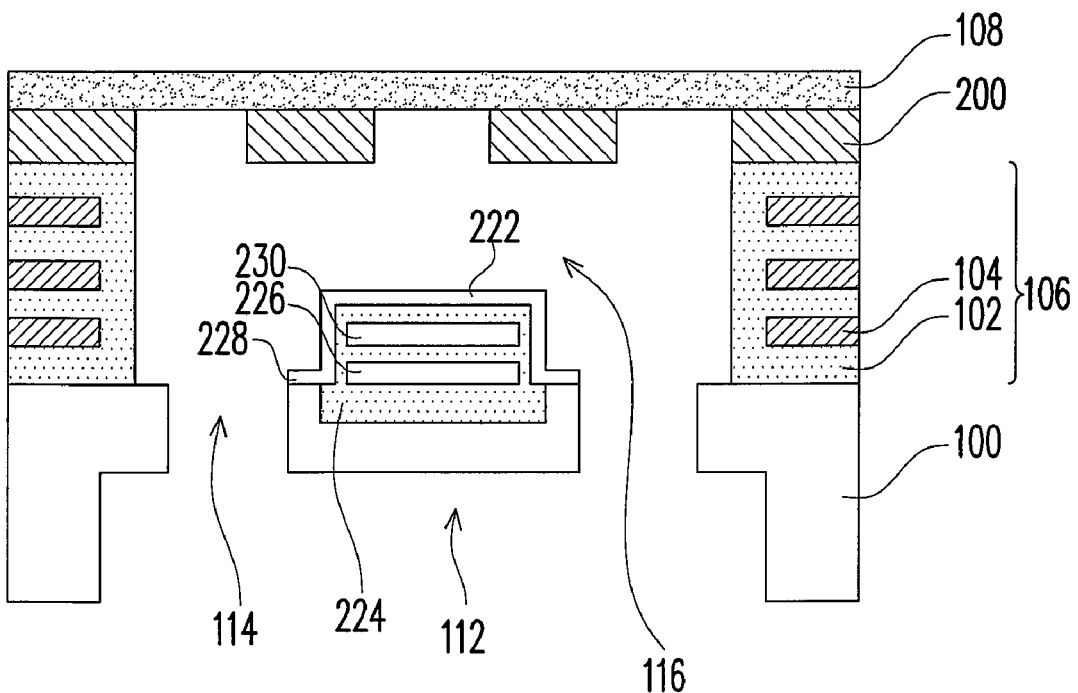

In FIG. 29 and FIG. 30, under the example that the etching stop layer 108 is over the conductive electrode layer 200, the charged conductive electrode 228 can be further formed on the substrate 100.

Figure 31:
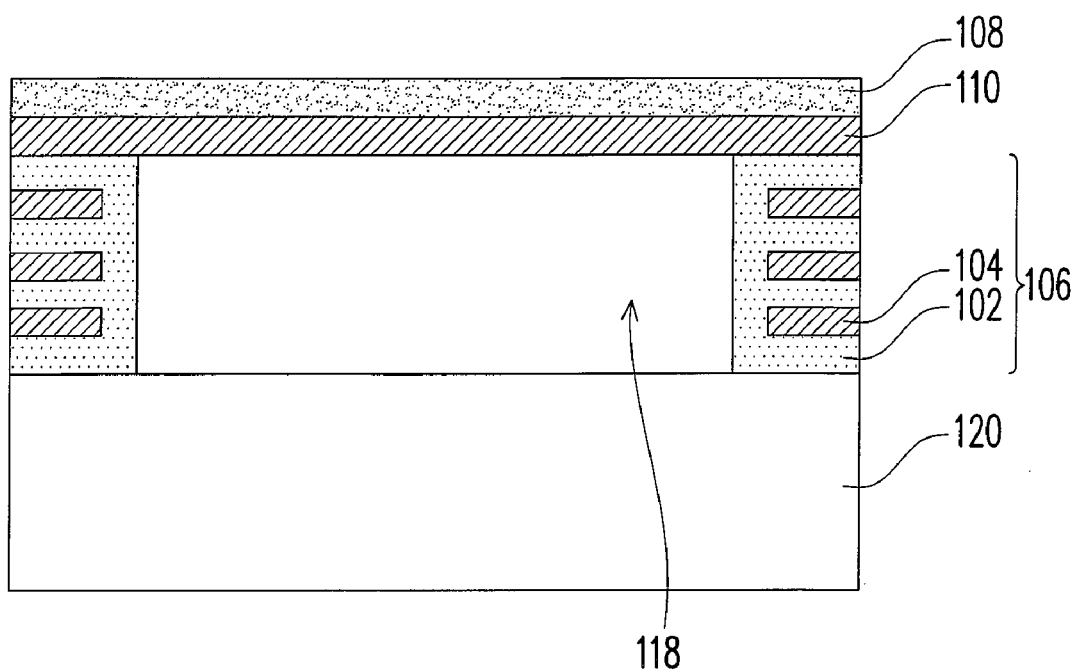
Figure 32:
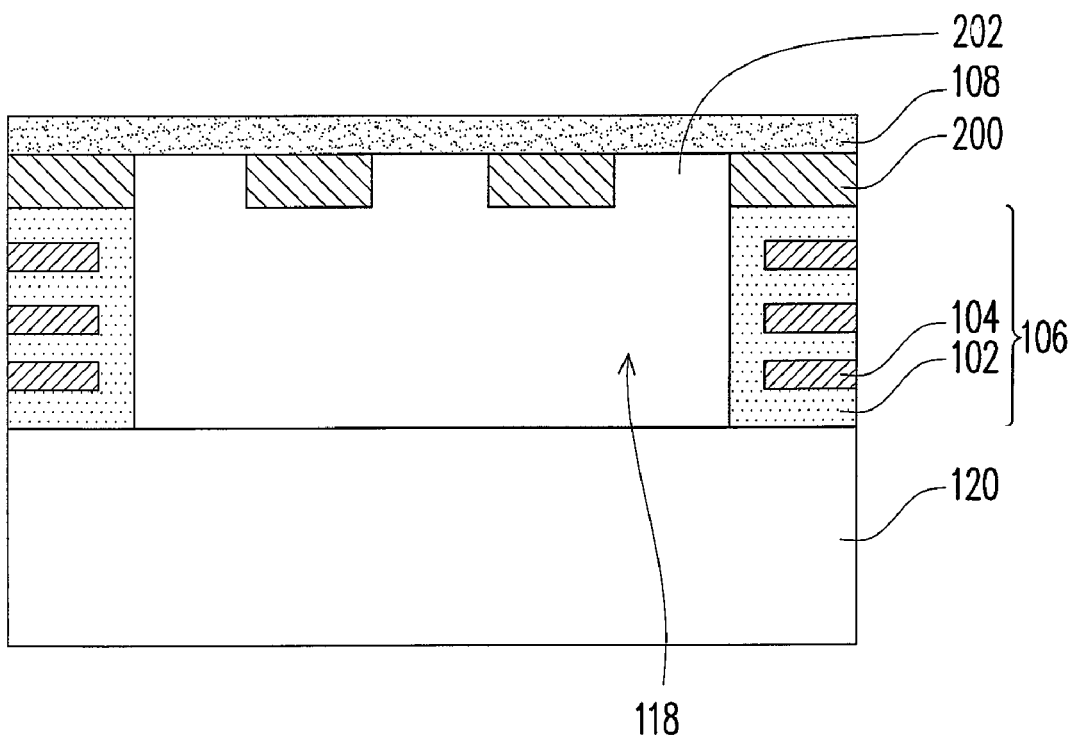
Figure 33:
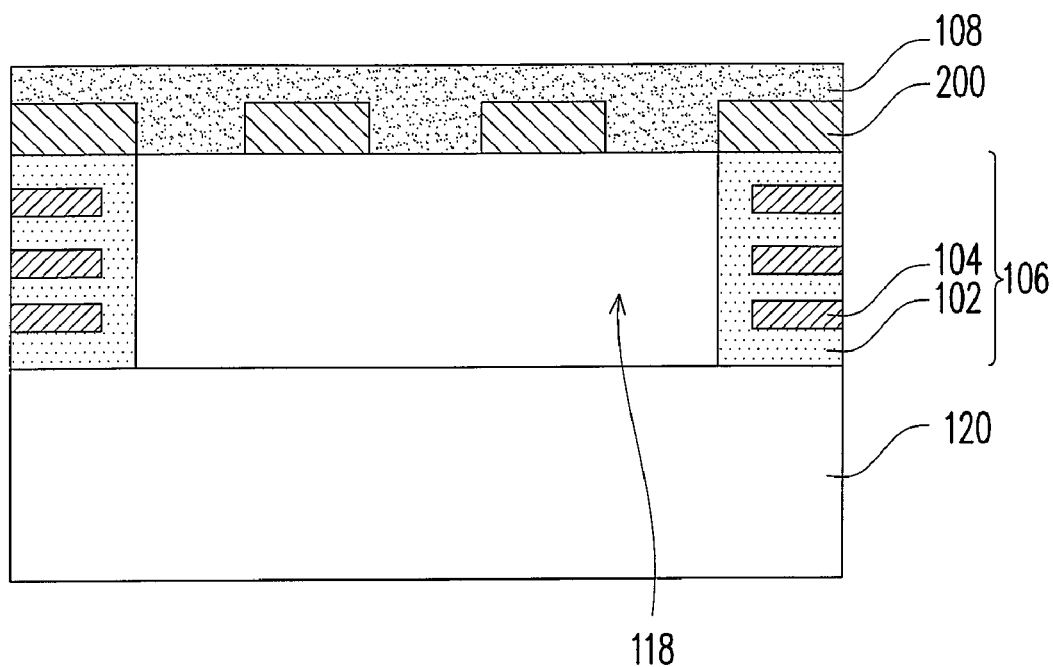
Figure 34:
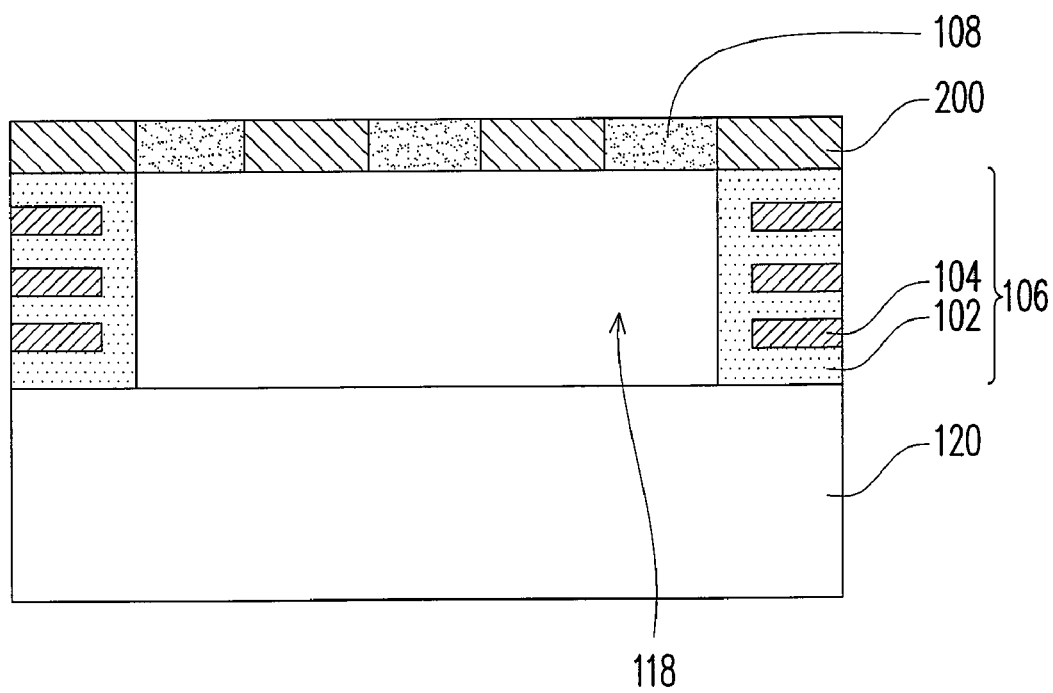
Figure 35:
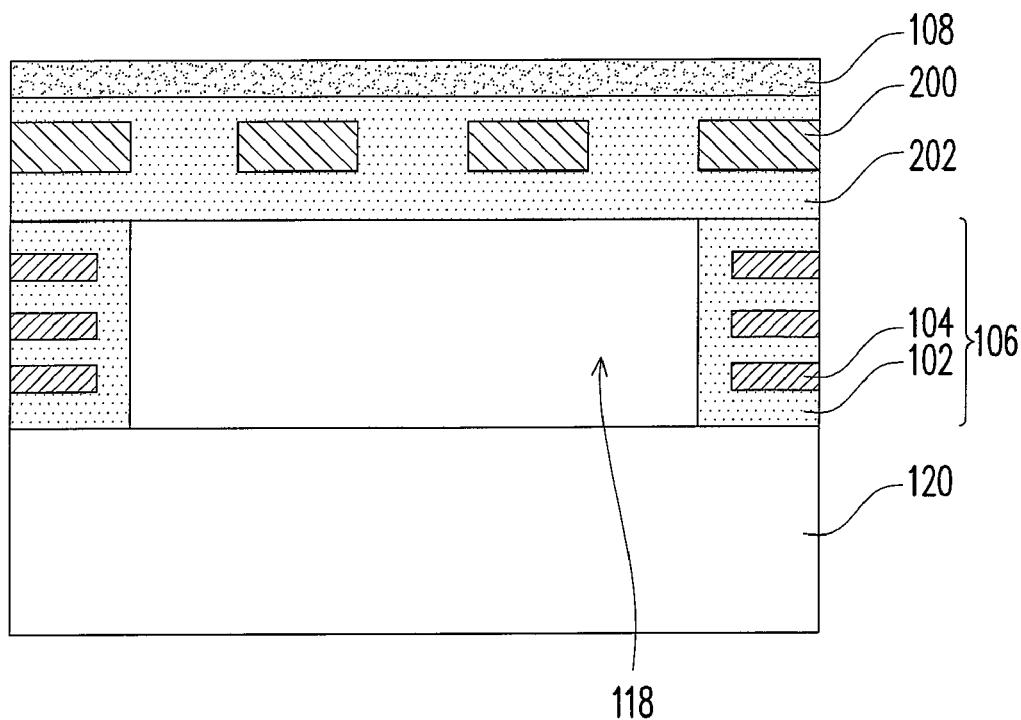
Figure 36:
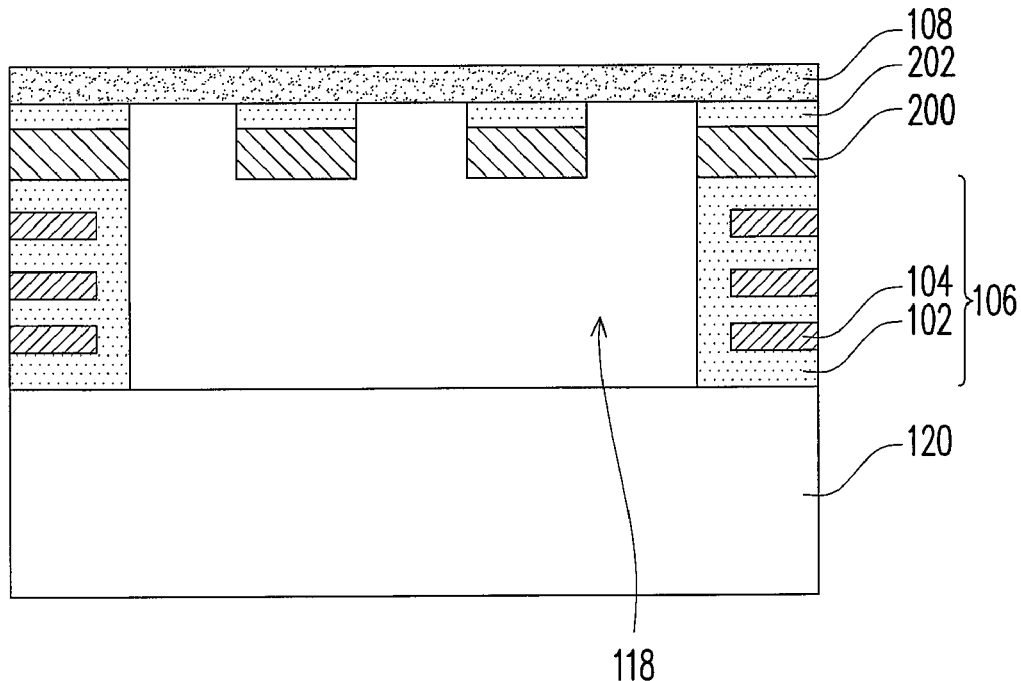
Figure 37:
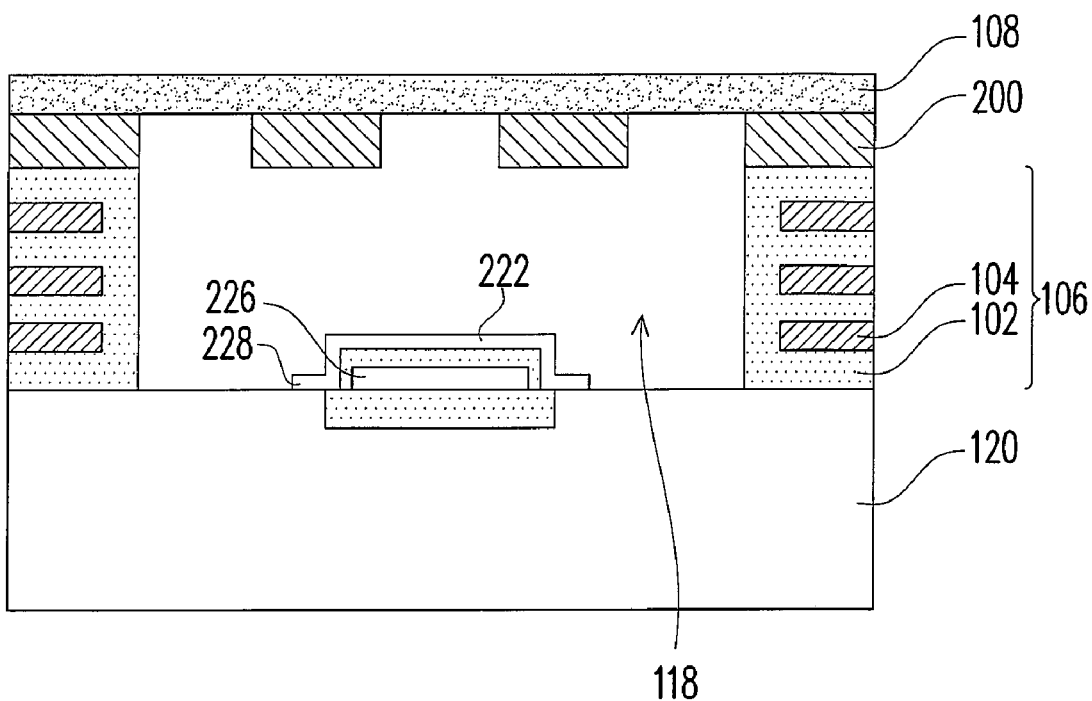
Figure 38:
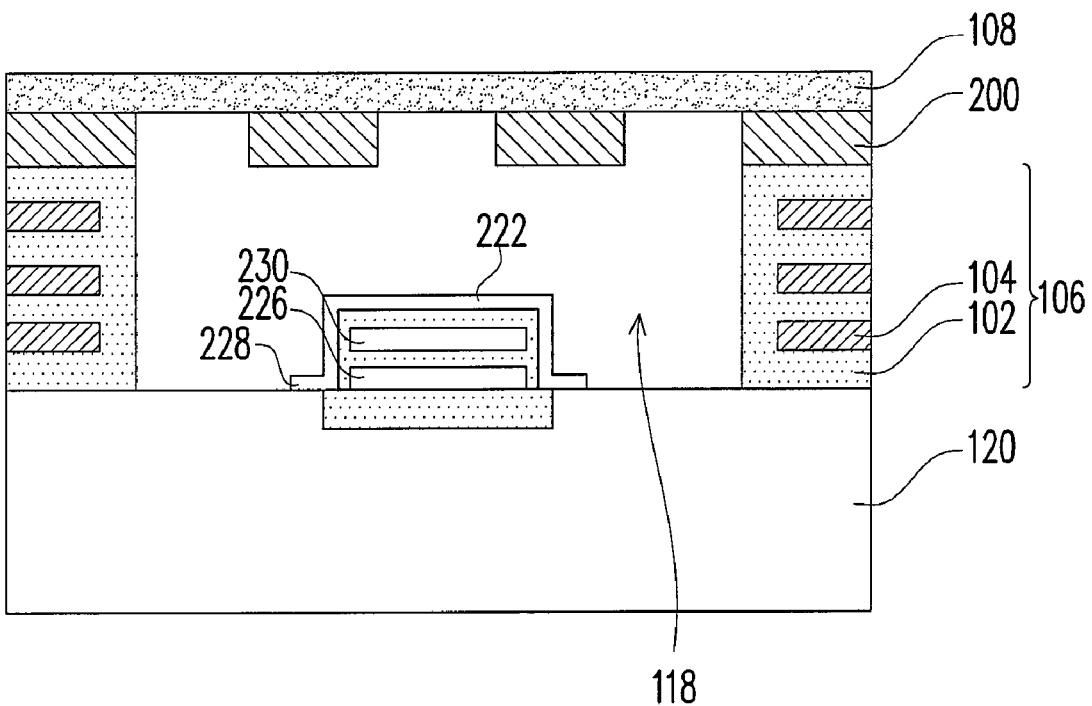

In FIG. 31, similar to FIG. 16, the conductive electrode layer can be formed over the dielectric structural layer 106 and then the etching stop layer 108 is formed over the conductive electrode layer 110. The chamber 118, according to the process in FIGS. 49A-49c or FIGS. 50A-50B, is formed above the substrate 120.

In FIGS. 32-38, as previously described, the etching stop layer 108 is modified in accordance with design option, while the substrate 120 has no venting hole. The chamber 118 is formed by different process, such as the process described in FIGS. 49A-49C or FIGS. 50A-50B. The further descriptions are omitted.

For the further design options, the etching stop layer and the conductive electrode layer can be modified in multi-layer structure. In other words, the diaphragm can, for example, include the conductive electrode structure with the etching stop layer. The etching stop layer can be used to form the conductive electrode structure in semiconductor fabrication process. As a result, the MEMS device can be integrated with the semiconductor IC.

Figure 39:
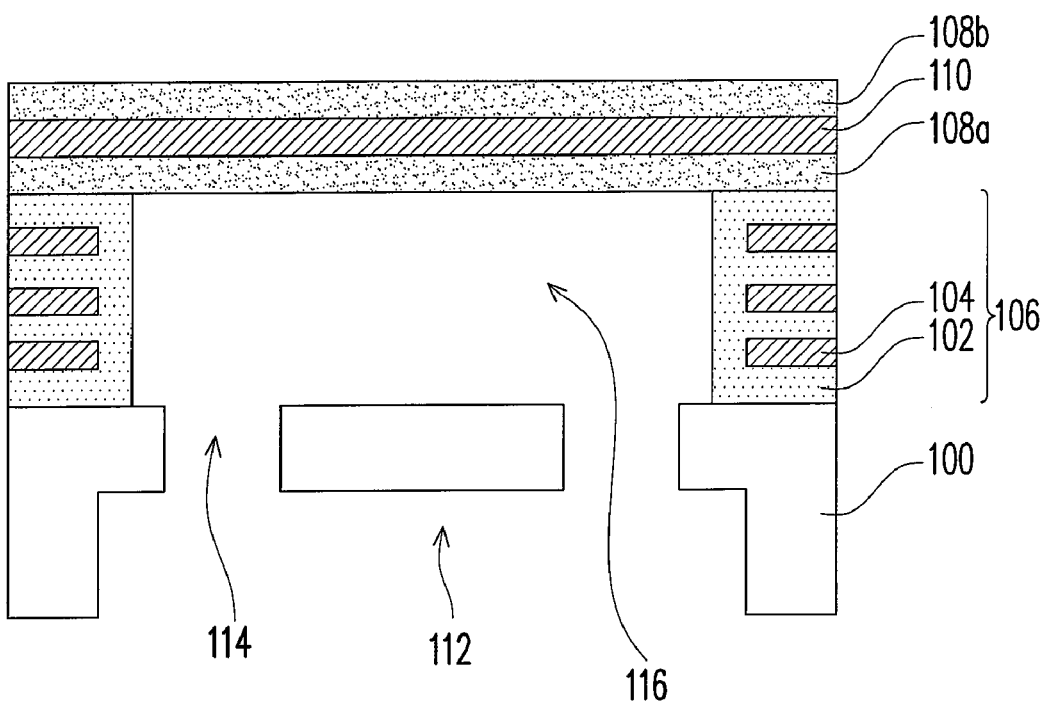

In FIG. 39, for the further examples, the etching stop layer with dual-layer 108a, 108b is an example. In this example, the diaphragm includes a bottom etching stop layer 108a and a top etching stop layer 108b. The conductive electrode layer 110 is between the two etching stop layer 108a and 108b.

Figure 40:
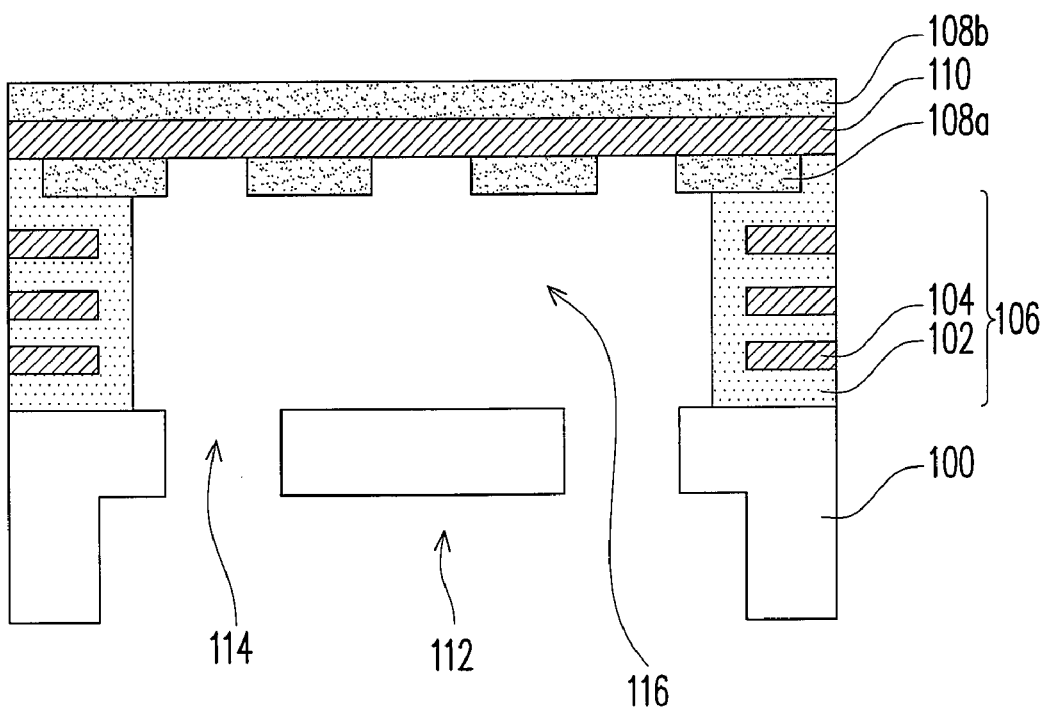
Figure 41:
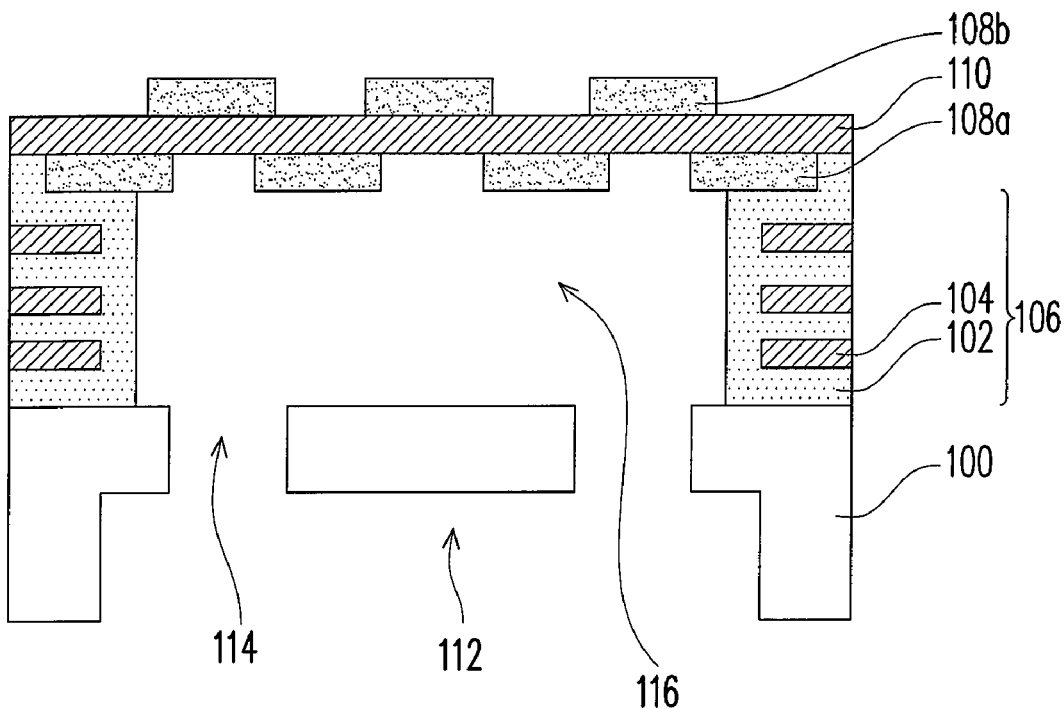

In FIG. 40, the bottom etching stop layer 108a can also, for example, have the pattern to expose a portion of the conductive electrode layer 110. In FIG. 41, the top etching stop layer 108b can also, for example, have the pattern to expose a portion of the conductive electrode layer 110.

Figure 42:
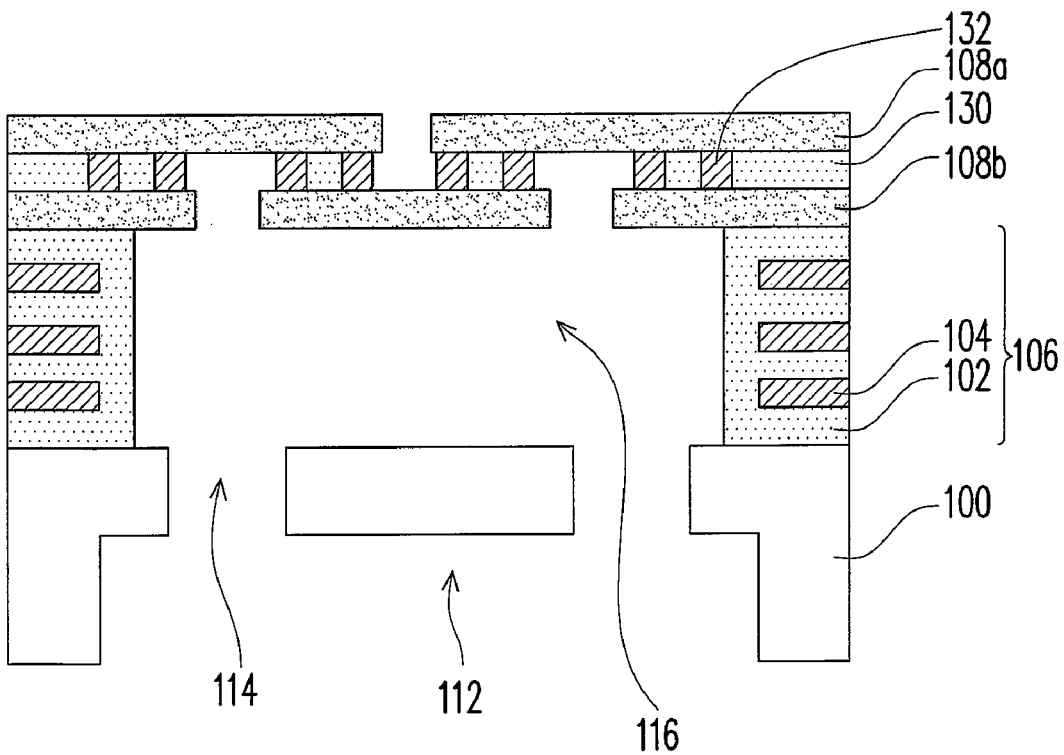
Figure 43:
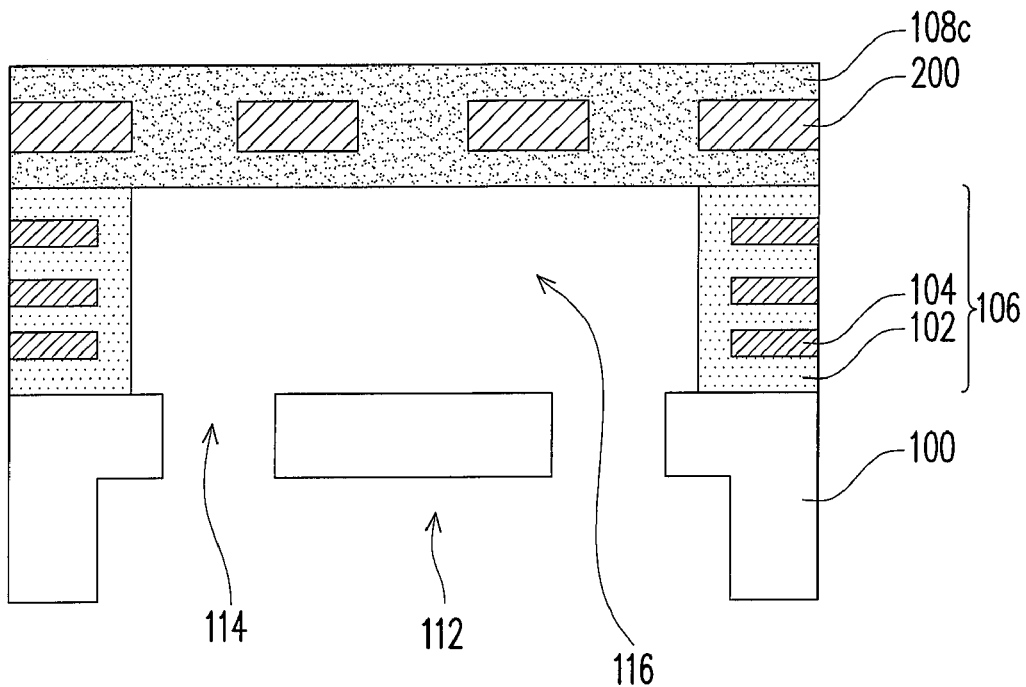
Figure 44:
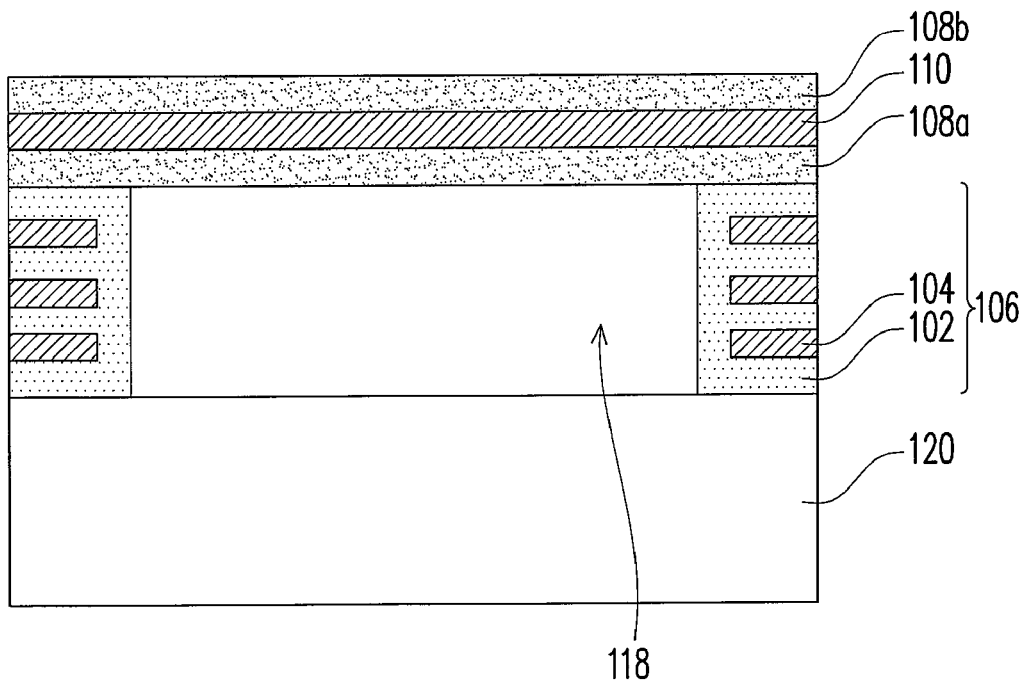
Figure 45:
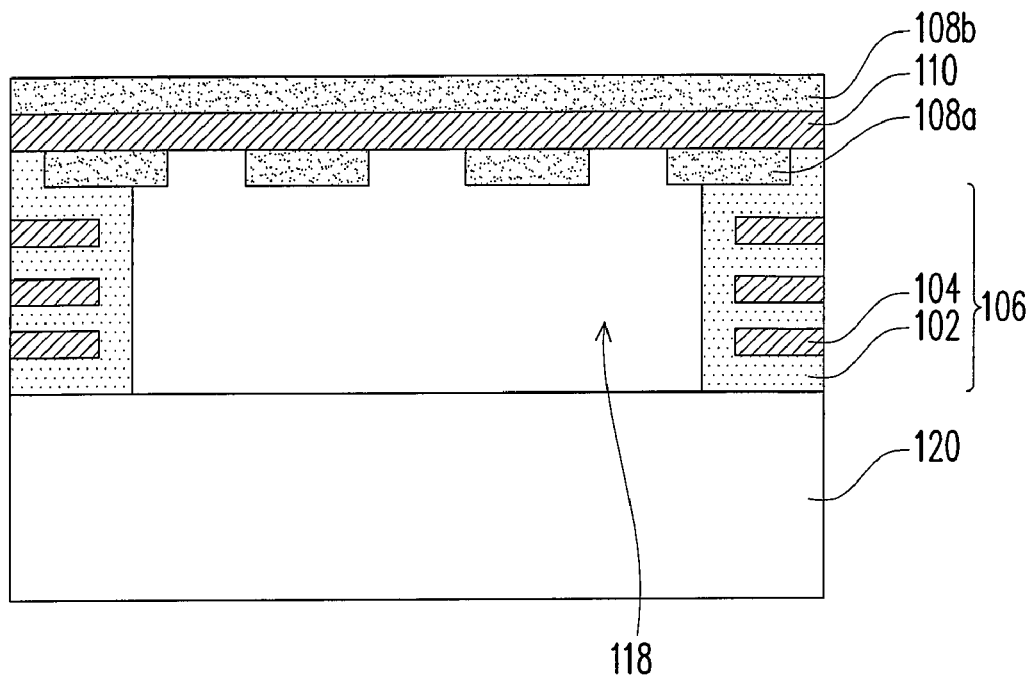
Figure 46:
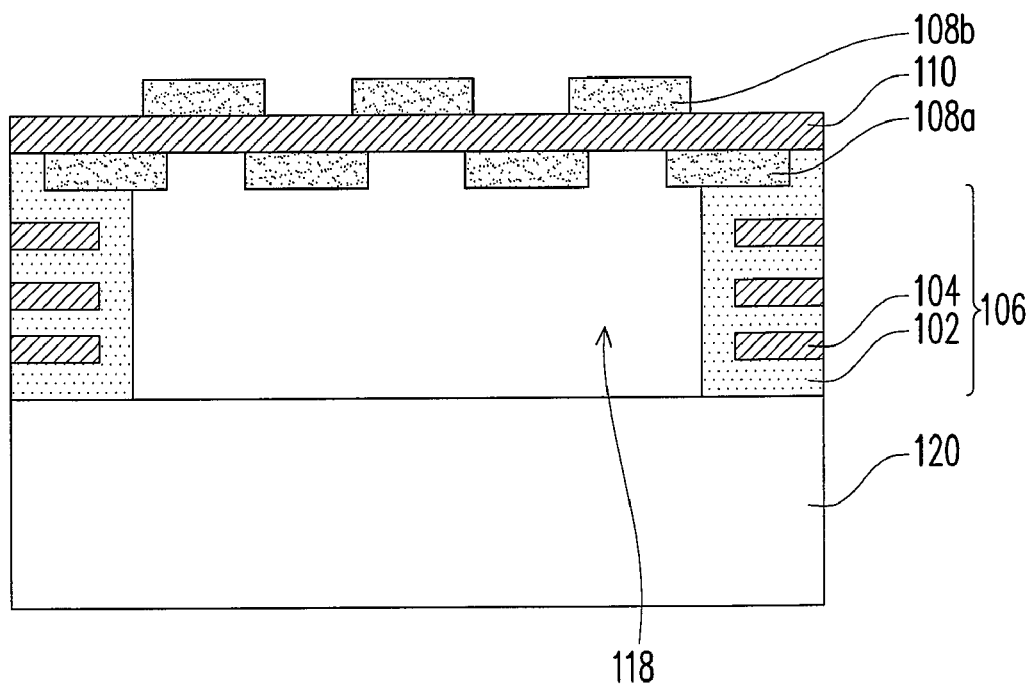
Figure 47:
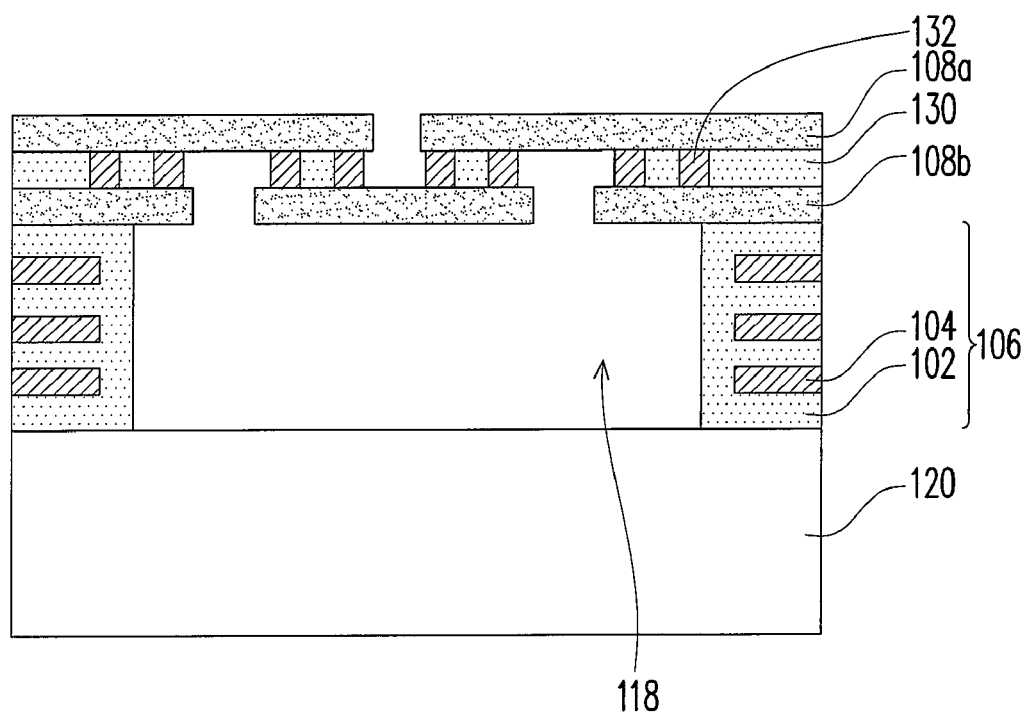
Figure 48:
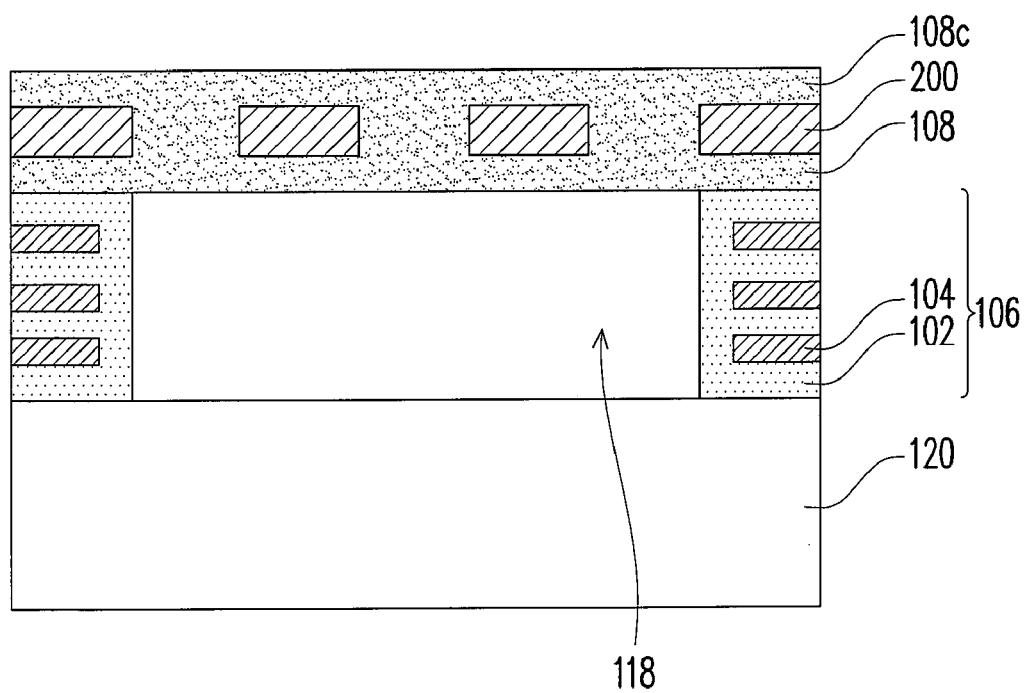

In FIG. 42, the conductive electrode layer 110 can also, for example, be a structure, such as the conductive via 132, which is formed in the dielectric layer 130. Further, the dielectric layer 130 with the conductive via 132 is between the bottom etching stop layer 108a and top etching stop layer 108b. In FIG. 43, the conductive electrode layer 200 can even also, for example, be embedded in the etching stop layer 108c.

In FIGS. 44-48, comparing with FIGS. 39-43, the etching stop layer and the conductive electrode layer can be, for example, as previously described. However, the substrate 120 has no venting hole or the cavity. The substrate 120 can even further formed with the semiconductor device, such as the additional charge storage device.

Figure 51A:
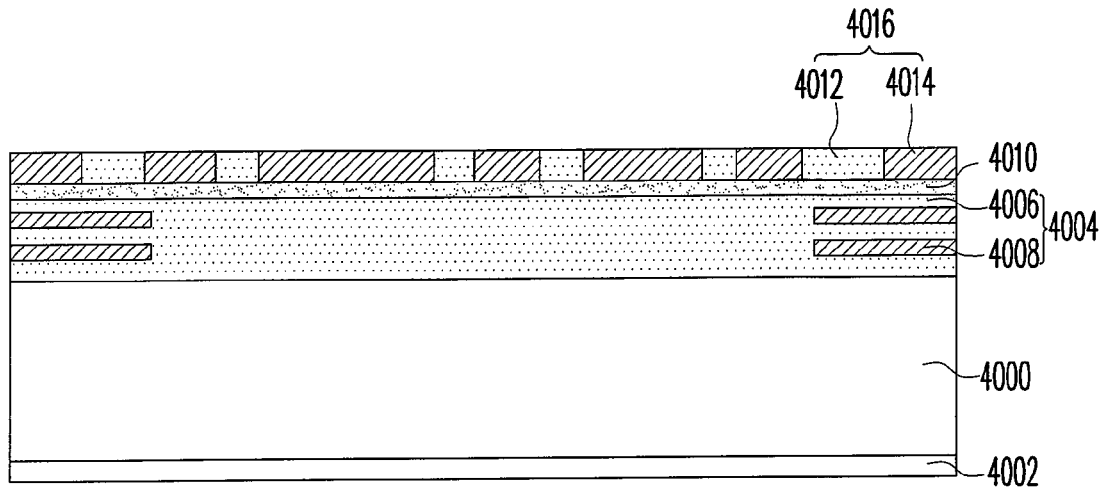
FIGS. 51A-51E are cross-sectional views, schematically illustrating a process flow for fabricating another semiconductor MEMS device, according to an embodiment of the invention.

FIG. 51A-51E are cross-sectional views, schematically illustrating a process flow for fabricating another semiconductor MEMS device, according to an embodiment of the invention. In FIG. 51A, a substrate 4000 has a hard mask layer 4002 on the back side and a first structural dielectric layer 4004 on the top side of the substrate 4000. The first structural dielectric layer 4004, as previously described, includes the dielectric layer 4006 with the embedded metal layer 4008. An etching stop layer 4010 is on the first structural dielectric layer 4004. A conductive electrode 4016, having the metal layer 4014 with the embedded dielectric layer 4012.

Figure 51B:
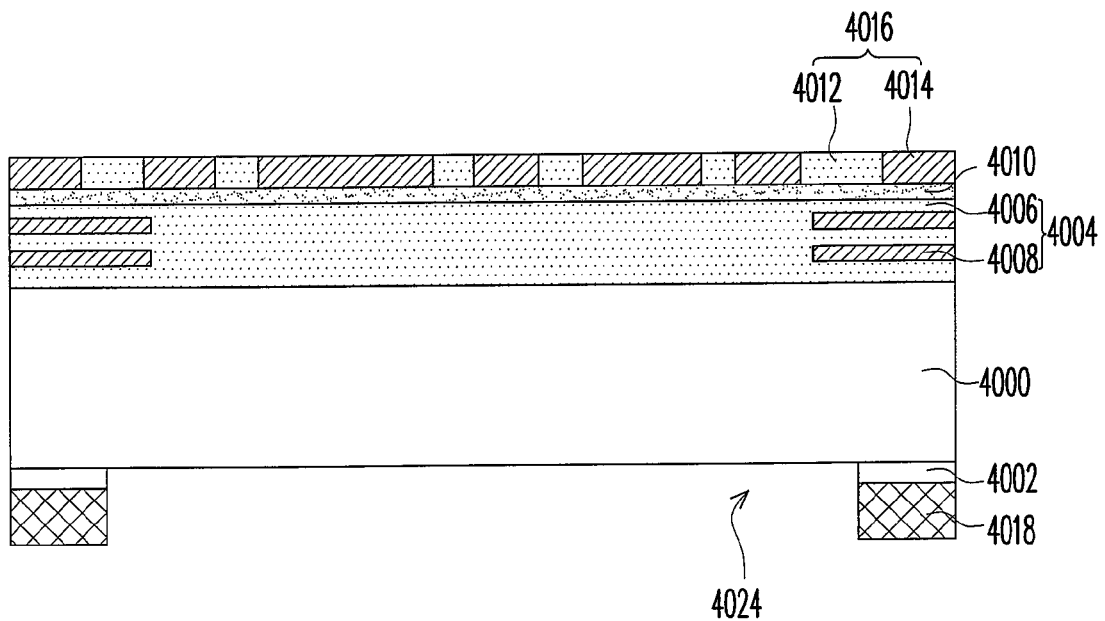
Figure 51C:
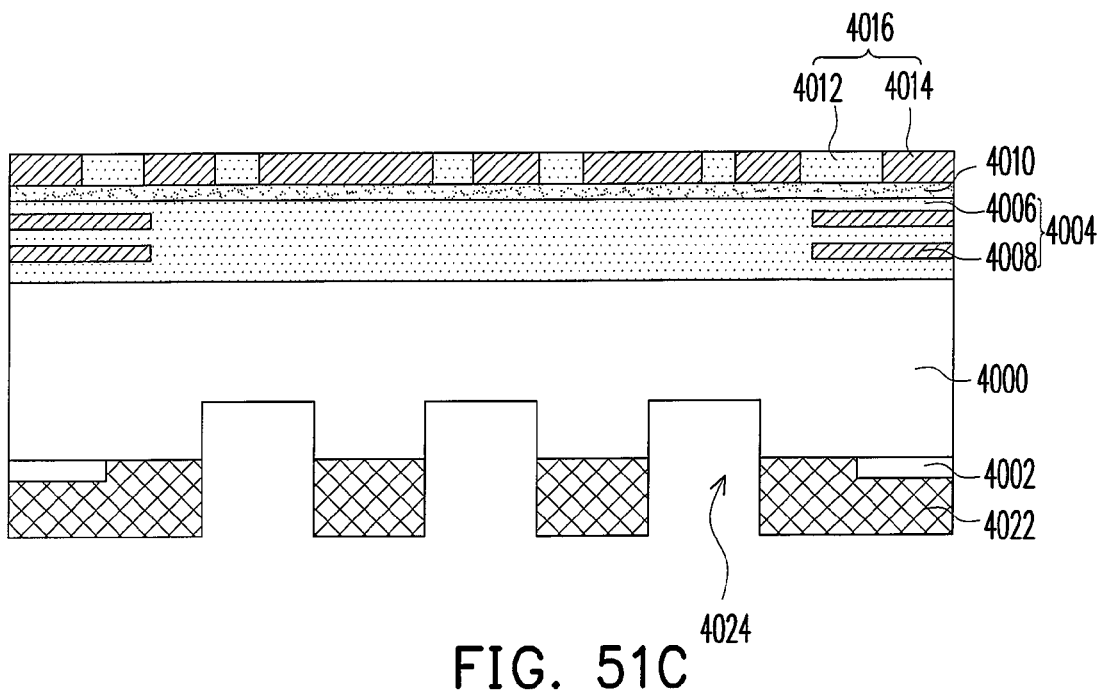
Figure 51D:
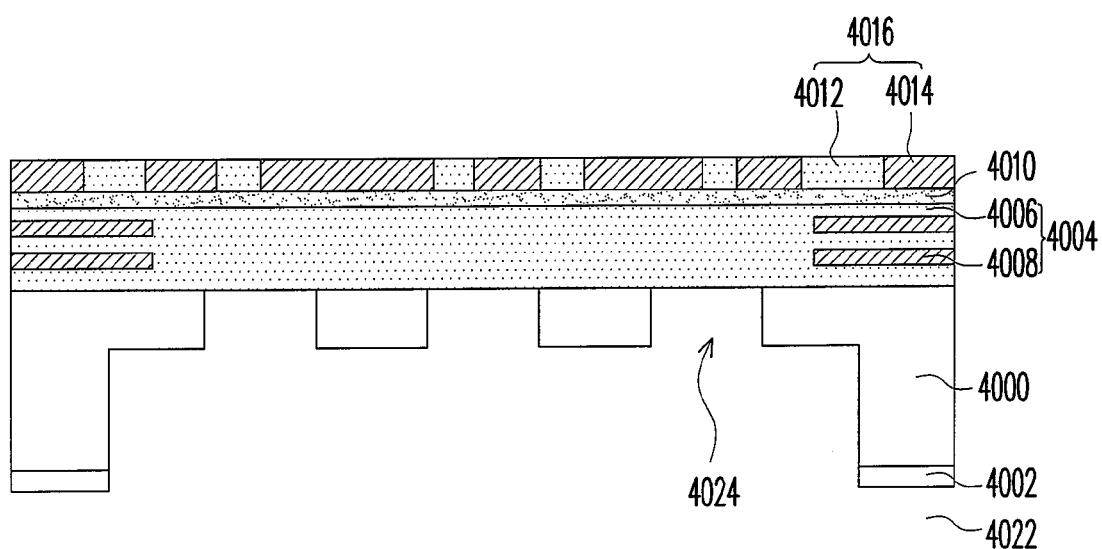

In FIG. 51B, a photoresist layer 4018 is formed on the hard mask layer 4002. The photoresist layer 4018 has the opening 4020 to expose the hard mask layer 4002. Then, a portion of the hard mask layer 4002 is etched to expose the substrate 4000. In FIG. 51C, another photoresist or hard mask layer 4022 is formed over the substrate 4000. The photoresist or hard mask layer 4022 has another opening to expose the substrate 4000. The substrate 4000 is etched to have a hole 4024 with a desired depth, using the photoresist or hard mask layer 4022 as the mask. In FIG. 51D, the photoresist or hard mask layer 4022 is removed. The substrate 4000 is then etched by using the hard mask layer 4002 as the etching mask. The first structural dielectric layer is then exposed by the hole 4024.

Figure 51E:
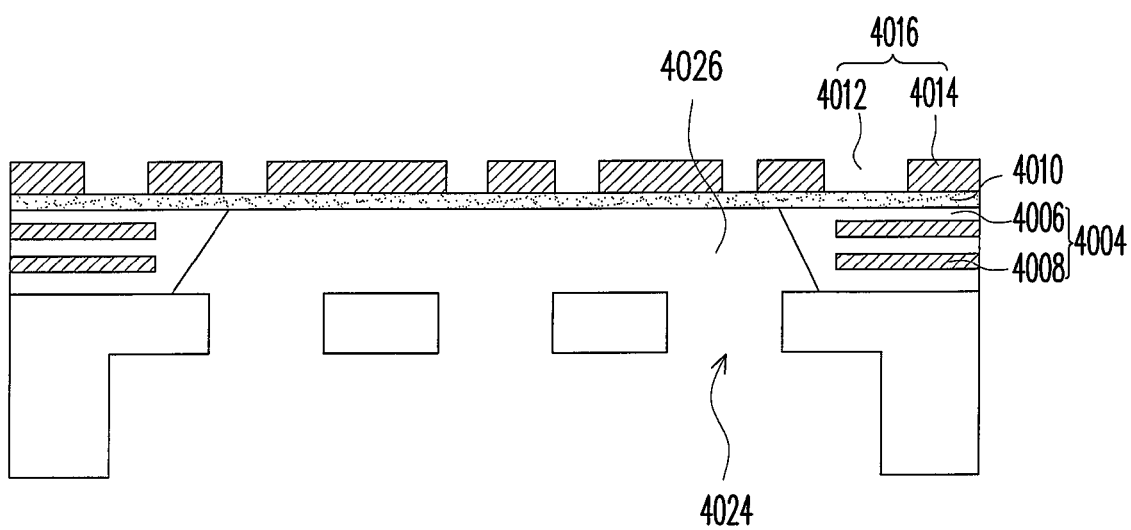

In FIG. 51E, the first structural dielectric layer 4004 is etched through the hole 4024, so as to form the chamber 4026 to expose the etching stop layer 4010. The etching process make use of an isotropic dry etch or a vapor HF etch to remove first structure dielectric layer 4004 and dielectric layer 4012.

In other words, the provided embodiments can be also properly combined to each other. It should be also noted that the conductive electrode structure can be any proper structure. The material, the layer structure or the number of structure layers is not necessary to be just limited to the embodiments.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A Micro-Electro-Mechanical Systems (MEMS) device, comprising: a substrate;
a dielectric structural layer, disposed over the substrate, wherein the dielectric structural layer has an opening to expose the substrate;
a diaphragm layer, disposed over the dielectric structural layer, wherein the diaphragm layer covers the opening of the dielectric structural layer to form a chamber, wherein the diaphragm layer comprises at least one etching stop layer, wherein a material of the etching stop layer comprises amorphous silicon, or polysilicon, wherein a conductive electrode structure comprises metal, composite metal layer, amorphous silicon or polysilicon; and
said conductive electrode structure, adapted in the diaphragm layer substantially extending over the opening to be vibrated together with the diaphragm and have a charge storage structure to store charges.

2. The MEMS device of claim 1, wherein the diaphragm layer includes the etching stop layer for carrying the conductive electrode structure.

3. The MEMS device of claim 2, wherein the conductive electrode structure is directly disposed on the etching stop layer.

4. The MEMS device of claim 3, wherein the conductive electrode structure includes an opening to expose the etching stop layer.

5. The MEMS device of claim 1, wherein the diaphragm layer includes an etching stop layer and a dielectric layer, and the conductive electrode structure is embedded in the dielectric layer.

6. The MEMS device of claim 5, further comprising a conductive layer over the diaphragm layer.

7. The MEMS device of claim 1, wherein the diaphragm layer includes an etching stop layer and a dielectric layer, and at least a portion of the dielectric layer is between the conductive electrode structure and the etching stop layer.

8. The MEMS device of claim 1, wherein the diaphragm layer includes an etching stop layer and at least a portion of the conductive electrode structure is in the etching stop layer.

9. The MEMS device of claim 8, wherein a sidewall surface of the conductive electrode structure is covered by the etching stop layer.

10. The MEMS device of claim 8, wherein a sidewall surface of the conductive electrode structure is covered by the etching stop layer, and at least one of an upper surface and a bottom surface of the conductive electrode structure is exposed.

11. The MEMS device of claim 8, wherein the etching stop layer includes an upper etching stop layer and a lower etching stop layer, the conductive electrode structure is between the upper etching stop layer and a lower etching stop layer.

12. The MEMS device of claim 11, wherein the conductive electrode structure is exposed by the etching stop layer.

13. The MEMS device of claim 11, wherein the conductive electrode structure is exposed by the lower etching stop layer is not exposed by the upper etching stop layer.

14. The MEMS device of claim 8, wherein the conductive electrode structure is embedded in the etching stop layer.

15. The MEMS device of claim 1, wherein the substrate fully covers the chamber.

16. The MEMS device of claim 1, wherein the substrate has a cavity at a backside and a venting hole in the substrate within the cavity, wherein the chamber is connected to the cavity through the venting hole.

17. The MEMS device of claim 1, further comprising a semiconductor structure over the substrate, facing to the chamber.

18. The MEMS device of claim 1, wherein the conductive electrode structure has an O/N/O (oxide/nitride/oxide) structure.

19. The MEMS device of claim 18, wherein the conductive electrode structure comprises a floating conductive layer for storing the charges.

20. The MEMS device of claim 1, wherein the substrate covers the chamber from a side of the dielectric structural layer opposite to the diaphragm layer without exposing the chamber, and a semiconductor device is formed on the substrate, facing to the chamber.

21. The MEMS device of claim 1, wherein the dielectric structural layer comprises an embedded conductive layer.

22. The MEMS device of claim 1, wherein the conductive electrode structure is exposed to the chamber.

23. The MEMS device of claim 1, wherein the conductive electrode structure is exposed to an outer space.

24. A Micro-Electro-Mechanical Systems (MEMS) device, comprising:

a substrate;

a dielectric structural layer, disposed over the substrate, wherein the dielectric structural layer has an opening to expose the substrate;

a diaphragm layer, disposed over the dielectric structural layer, wherein the diaphragm layer covers the opening of the dielectric structural layer to form a chamber, wherein the diaphragm layer comprises at least one etching stop layer; and a conductive electrode structure, adapted in the diaphragm layer substantially extending over the opening to be vibrated together with the diaphragm and have a charge storage structure to store charges, wherein the diaphragm layer includes a first etching stop layer, a second etching stop layer, and a dielectric layer between the first etching stop layer and the second etching stop layer, wherein the conductive electrode structure is a conductive via in the dielectric layer between the first etching stop layer and the second etching stop layer.

* * * * *